(12) United States Patent
Bengtsson et al.

(10) Patent No.: US 7,072,421 B2
(45) Date of Patent: Jul. 4, 2006

(54) IQ MODULATION SYSTEMS AND METHODS THAT USE SEPARATE PHASE AND AMPLITUDE SIGNAL PATHS AND PERFORM MODULATION WITHIN A PHASE LOCKED LOOP

(75) Inventors: Erik Bengtsson, Cary, NC (US);
Aristotle Hadjichristos, Apex, NC (US); Scott R. Justice, Durham, NC (US)

(73) Assignee: Telefonaktiebolaget L.M. Ericsson, Stockholm (SE)

( * ) Notice: Subject to any disclaimer, the term of this patent is extended or adjusted under 35 U.S.C. 154(b) by 923 days.

(21) Appl. No.: 09/746,823

(22) Filed: Dec. 22, 2000

(65) Prior Publication Data

US 2002/0071497 A1    Jun. 13, 2002

Related U.S. Application Data

(63) Continuation-in-part of application No. 09/703,037, filed on Oct. 31, 2000, now Pat. No. 6,975,686.

(51) Int. Cl.
*H04L 27/36* (2006.01)

(52) U.S. Cl. ...................... 375/298; 332/127

(58) Field of Classification Search ............. 375/298,
375/300, 301, 302, 322, 327, 317, 296, 371,
375/373, 375, 376, 269, 279, 297, 258, 306,
375/345; 332/108, 119, 120, 123, 125, 126,
332/127, 128, 145, 159–160, 162; 455/138,
455/139, 137, 110, 114.3, 126, 127.1, 127.2
See application file for complete search history.

(56) References Cited

U.S. PATENT DOCUMENTS 4,481,672 A    11/1984   Watkinson
4,952,888 A *  8/1990    Izumi ................... 332/124

(Continued)

FOREIGN PATENT DOCUMENTS

EP       0 905 878 A2    3/1999

(Continued)

OTHER PUBLICATIONS

Gore et al., *An Improved Digital Modulator*, Research Disclosure, Aug. 1999, #42421.

(Continued)

*Primary Examiner*—Khanh Tran
(74) *Attorney, Agent, or Firm*—Myers Bigel Sibley & Sajovec

(57) ABSTRACT

A digital signal processor generates in-phase, quadrature-phase and amplitude signals from a baseband signal. A modulator modulates the in-phase and quadrature-phase signals to produce a modulated signal. A phase locked loop is responsive to the modulated signal. The phase locked loop includes a controlled oscillator having a controlled oscillator input. An amplifier includes a signal input, amplitude control input and an output. The signal input is responsive to the controlled oscillator output and the amplitude control input is responsive to the amplitude signal. The phase locked loop that is responsive to the modulated signal includes a controlled oscillator output and a feedback loop between the controlled oscillator input and the controlled oscillator output. The feedback loop includes a mixer that is responsive to a local oscillator. The modulator may be placed in the phase locked loop. In particular, the modulator may be placed in the feedback loop between the controlled oscillator output and the mixer, between the local oscillator and the mixer, or between the mixer and the controlled oscillator input.

17 Claims, 18 Drawing Sheets

U.S. PATENT DOCUMENTS

| | | | | |
|---|---|---|---|---|
| 4,965,531 A | * | 10/1990 | Riley | 331/1 A |
| 5,251,330 A | | 10/1993 | Chiba et al. | 455/91 |
| 5,313,173 A | * | 5/1994 | Lampe | 332/103 |
| 5,412,353 A | * | 5/1995 | Chaplik et al. | 332/127 |
| 5,420,536 A | | 5/1995 | Faulkner et al. | |
| 5,705,959 A | * | 1/1998 | O'Loughlin | 332/151 |
| 5,737,694 A | * | 4/1998 | McMahill et al. | 455/76 |
| 5,886,572 A | | 3/1999 | Myers et al. | 330/10 |
| 5,920,596 A | | 7/1999 | Pan et al. | 375/238 |
| 5,945,854 A | | 8/1999 | Sadowski | 327/156 |
| 5,952,895 A | * | 9/1999 | McCune et al. | 332/128 |
| 6,018,275 A | * | 1/2000 | Perrett et al. | 332/127 |
| 6,181,199 B1 | | 1/2001 | Camp, Jr. et al. | 330/10 |
| 6,211,747 B1 | * | 4/2001 | Trichet et al. | 332/128 |
| 6,236,267 B1 | * | 5/2001 | Anzil | 330/149 |
| 6,259,747 B1 | | 7/2001 | Gustafsson et al. | 375/298 |
| 6,295,442 B1 | * | 9/2001 | Camp et al. | 455/102 |
| 6,311,046 B1 | | 10/2001 | Dent | |
| 6,369,651 B1 | | 4/2002 | Dent | |
| 6,411,655 B1 | * | 6/2002 | Holden et al. | 375/269 |
| 6,415,002 B1 | * | 7/2002 | Edwards et al. | 375/261 |
| 6,420,940 B1 | * | 7/2002 | Minnis et al. | 332/103 |
| 6,449,465 B1 | * | 9/2002 | Gailus et al. | 455/126 |
| 6,549,562 B1 | * | 4/2003 | Olaker et al. | 375/139 |
| 6,560,297 B1 | * | 5/2003 | Broughton | 375/308 |
| 6,631,254 B1 | * | 10/2003 | Wilson et al. | 455/91 |
| 6,671,337 B1 | * | 12/2003 | Cordoba | 375/345 |
| 6,693,956 B1 | * | 2/2004 | Yamamoto | 375/219 |
| 6,693,969 B1 | * | 2/2004 | Montalvo et al. | 375/259 |
| 6,707,857 B1 | * | 3/2004 | Cairns | 375/296 |
| 2001/0030581 A1 | | 10/2001 | Dent | |
| 2002/0067773 A1 | | 6/2002 | Jackson et al. | 375/308 |
| 2003/0143960 A1 | | 7/2003 | Yamawaki et al. | 455/86 |

FOREIGN PATENT DOCUMENTS

EP   0 998 088 A2   5/2000

OTHER PUBLICATIONS

International Search Report, PCT/US 01/46111, Apr. 25, 2003.

* cited by examiner

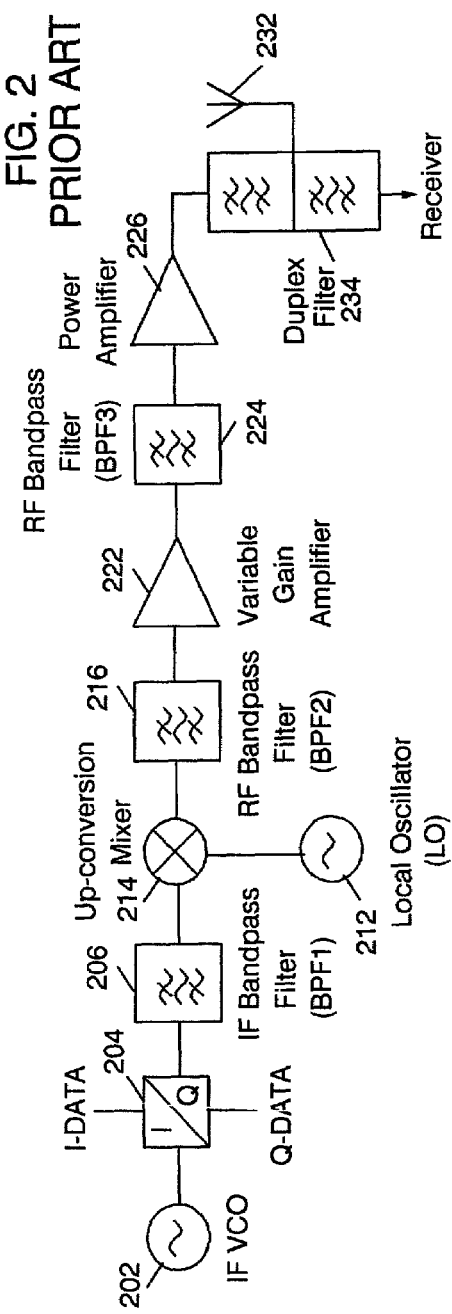
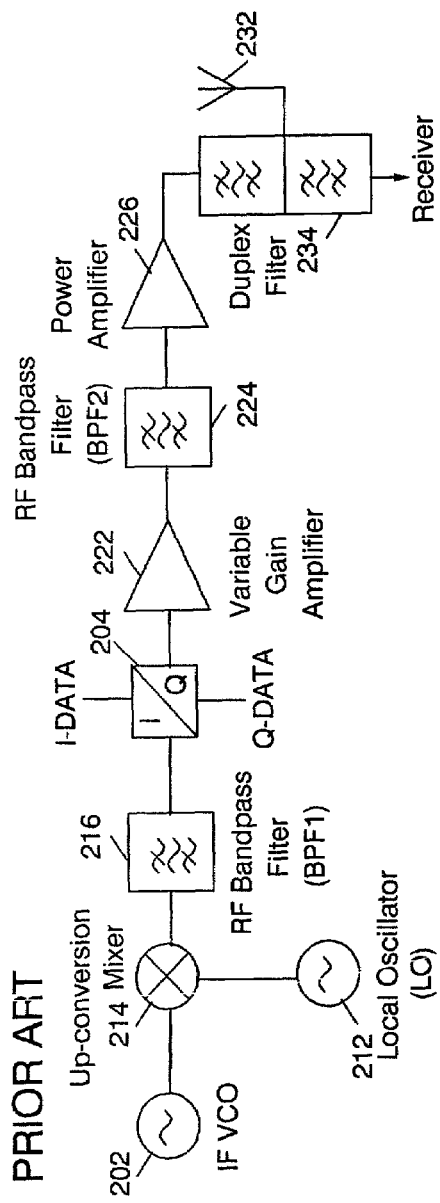
FIG. 2 PRIOR ART
FIG. 3 PRIOR ART

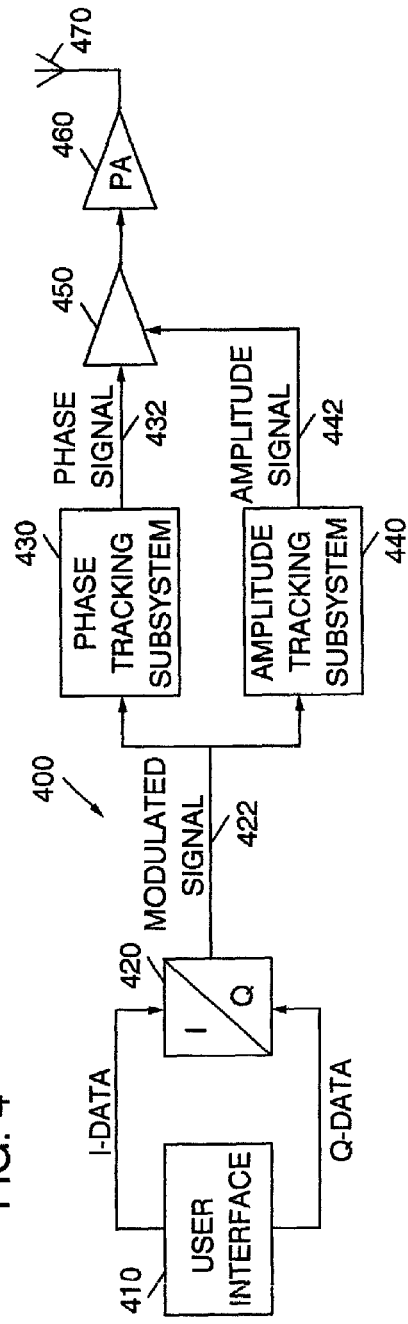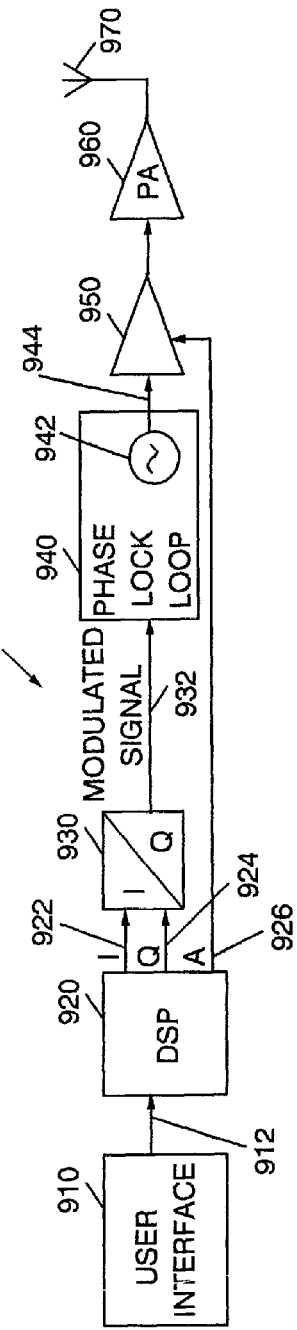

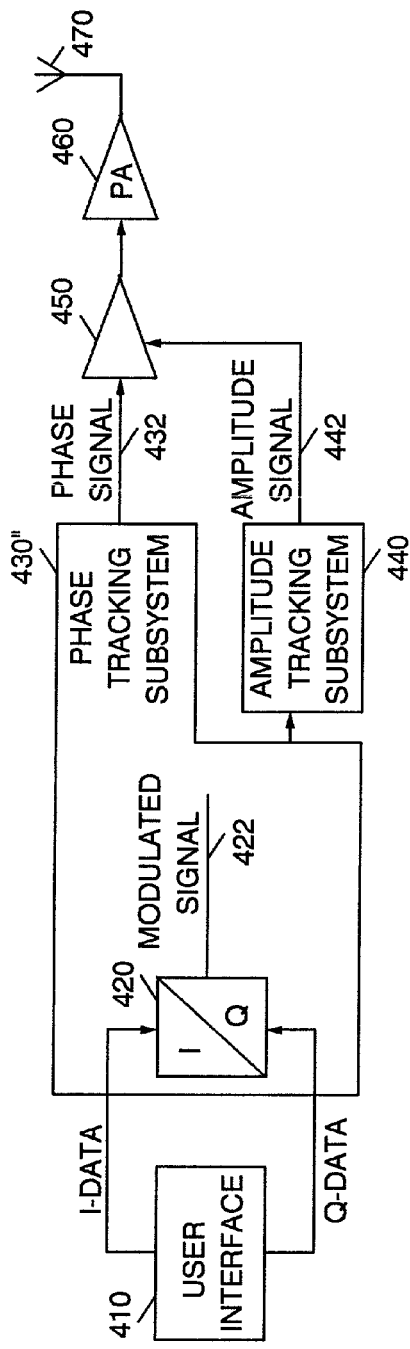
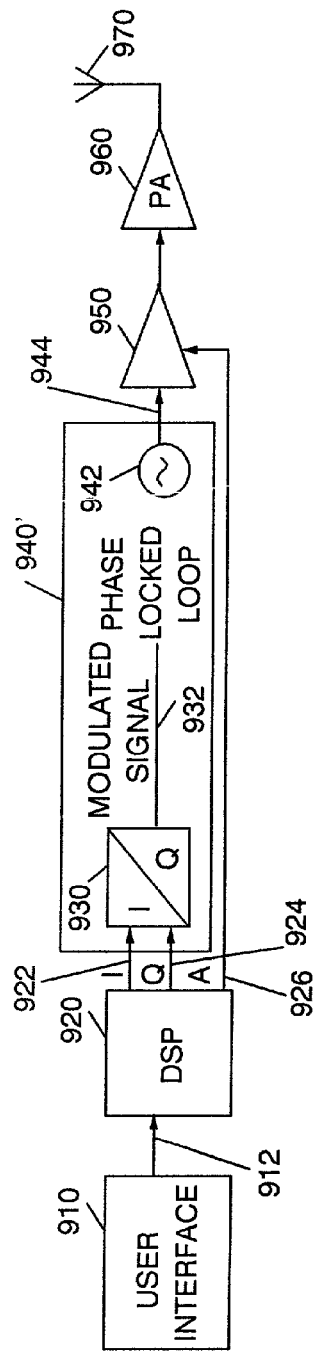

US 7,072,421 B2
// 1

IQ MODULATION SYSTEMS AND METHODS THAT USE SEPARATE PHASE AND AMPLITUDE SIGNAL PATHS AND PERFORM MODULATION WITHIN A PHASE LOCKED LOOP

CROSS REFERENCE TO RELATED APPLICATION

This application is a Continuation-in-Part (CIP) of application Ser. No. 09/703,037, filed Oct. 31, 2000, now U.S. Pat. No. 6,975,686 entitled IQ Modulation Systems and Methods That Use Separate Phase and Amplitude Signal Paths, assigned to the assignee of the present invention, the disclosure of which is hereby incorporated herein by reference.

FIELD OF THE INVENTION

This invention relates to modulation systems and methods, and more particularly to IQ modulation systems and methods.

BACKGROUND OF THE INVENTION

Modulation systems and methods are widely used in transmitters to modulate information including voice and/or data onto a carrier. The carrier may be a final carrier or an intermediate carrier. The carrier frequency can be in UHF, VHF, RF, microwave or any other frequency band. Modulators also are referred to as "mixers" or "multipliers". For example, in a wireless communications terminal such as a mobile radiotelephone, a modulator can be used for the radiotelephone transmitter.

FIG. 1 illustrates a conventional IQ modulator. As shown in FIG. 1, an IQ modulator 110, also referred to as a "quadraphase modulator" or a "quadrature modulator", includes a quadrature splitter 120, also known as a 90° phase shifter, and a pair of multipliers 116a, 116b coupled to the quadrature splitter. A controlled oscillator 115, such as a Voltage Controlled Oscillator (VCO), is coupled to the quadrature splitter 120 to produce 90° phased shifted oscillator signals. In-phase (I) data 111a and quadrature-phase (Q) data 111b are coupled to a respective multiplier or mixer 116a, 116b. Digital input data is converted to analog data by I Digital-to-Analog Converter (DAC) 114a and Q DAC 114b, respectively. The outputs of the respective DACs 114a and 114b are applied to the respective low pass filters 112a and 112b to provide the respective I and Q data inputs 111a and 111b. The modulator 110 modulates the input data on a carrier by summing the outputs of the multipliers 116a, 116b at a summing node 118. The modulated carrier 113 is amplified by a power amplifier 122 and transmitted via an antenna 124.

In modern wireless communications, wireless communications terminals such as mobile radiotelephones continue to decrease in size, cost and/or power consumption. In order to satisfy these objectives, it generally is desirable to provide IQ modulation systems and methods that can provide high power modulation while reducing the amount of battery power that is consumed. Unfortunately, the power amplifier 122 of an IQ modulator may consume excessive power due to efficiency limitations therein. More specifically, it is known to provide a linear class-A or class-AB power amplifier 122 that may have efficiencies as low as 30 percent or less. Thus, large amounts of battery power may be wasted as heat. Moreover, the noise figure of a conventional IQ modulator may be excessive so that high cost Surface Acoustic Wave (SAW) filters may need to be used.

FIG. 2 illustrates other conventional modulation systems. As shown in FIG. 2, I-data and Q-data is modulated on an Intermediate Frequency (IF) signal supplied by a controlled oscillator such as a voltage controlled oscillator 202 by applying the I-data and Q-data and the output of the IF voltage controlled oscillator 202 to an IQ modulator 204. The output of the modulator is then bandpass filtered by an IF bandpass filter 206. A local oscillator 212 and an up-conversion mixer 214 are used to up-convert the output of the bandpass filter 206 to a desired radio frequency. The output of the up-conversion mixer 214 is bandpass filtered by a radio frequency bandpass filter 216 to reduce noise and spurious levels. The filtered signal is then amplified using a variable gain amplifier 222 to provide the appropriate signal level to a power amplifier 226 which delivers the signal to an antenna 232 via a duplex filter 234. Additional RF bandpass filtering 224 may be used between the variable gain amplifier 222 and the power amplifier 226.

FIG. 3 is a block diagram of other conventional modulation systems wherein like elements to FIG. 2 are labeled with like numbers. The approach shown in FIG. 3 is similar to that of FIG. 2 except the IF signal is up-converted to the RF band first and then modulated in the IQ modulator 204.

Unfortunately, in either of the conventional approaches of FIGS. 2 or 3, the IQ modulator 204, up-conversion mixer 214 and/or the variable gain amplifier 222 may generate significant amounts of additive noise and spurious levels which may need to be filtered before the signal reaches the power amplifier 226. Systems of FIGS. 2 and 3 also may suffer from high current consumption and may need to use an excessive number of filters to meet the desired output spurious level and desired noise level.

It also is known to separately modulate the amplitude and phase of an input signal using an "rTheta" technique. In the rTheta technique, the phase is modulated at the oscillator, and the amplitude is modulated at the power amplifier stage. Unfortunately, the rTheta technique may require the oscillator phase locked loop to support the phase modulation bandwidth. With wide bandwidth radiotelephone signals such as TDMA and CDMA signals, it may be increasingly difficult to provide the requisite bandwidth in the oscillator phase locked loop.

SUMMARY OF THE INVENTION

Embodiments of the present invention provide modulation systems and methods having separate phase and amplitude signal paths. In particular, according to embodiments of the present invention, a digital signal processor generates in-phase, quadrature-phase and amplitude signals from a baseband signal. A modulator modulates the in-phase and quadrature-phase signals to produce a modulated signal. A phase locked loop is responsive to the modulated signal. The phase locked loop includes a controlled oscillator having a controlled oscillator input. An amplifier includes a signal input, an amplitude or gain control input and an output. The signal input is responsive to the controlled oscillator output and the amplitude control input is responsive to the amplitude signal.

In other embodiments according to the present invention, the in-phase and quadrature-phase signals are normalized in-phase and quadrature-phase signals. In these embodiments, the digital signal processor generates the normalized in-phase signal as a respective sine or cosine of an angle theta and generates the normalized quadrature-phase signal as a respective cosine or sine of the angle theta, where theta is an angle whose tangent is the quadrature-phase signal divided by the in-phase signal. The amplitude signal also is normalized and is generated as the square root of the sum of the in-phase signal squared and the quadrature-phase signal squared.

In other embodiments, the modulator is a first modulator and the modulated signal is a first modulated signal. These embodiments further comprise a second modulator that is responsive to the controlled oscillator output to produce a second modulated signal wherein the phase locked loop also is responsive to the second modulated signal. Moreover, in other embodiments a power control signal also is provided and the amplitude control input is responsive to the amplitude signal and to the power control signal.

In yet other embodiments, the phase locked loop that is responsive to the modulated signal includes a controlled oscillator having a controlled oscillator output and a feedback loop between the controlled oscillator input and the controlled oscillator output. The feedback loop includes a mixer that is responsive to a local oscillator. In these embodiments, the modulator may be placed in the phase locked loop. In some embodiments, the modulator may be placed in the feedback loop between the controlled oscillator output and the mixer, between the local oscillator and the mixer, or between the mixer and the controlled oscillator input. Thus, modulation may take place within the phased lock loop instead of, or in addition to, taking place prior to the phased lock loop.

Other modulation systems and methods according to embodiments of the invention include a quadrature modulator that modulates in-phase and quadrature-phase signals to produce a modulated signal. A phase tracking subsystem is responsive to the quadrature modulator to produce a phase signal that is responsive to phase changes in the modulated signal and that is independent of amplitude changes in the modulated signal. An amplitude tracking subsystem is responsive to the modulator to produce an amplitude signal that is responsive to amplitude changes in the modulated signal and that is independent of the phase changes in the modulated signal. An amplifier has a signal input, an amplitude control input and an output. The signal input is responsive to the phase signal and the amplitude control input is responsive to the amplitude signal.

In other embodiments, the phase tracking subsystem comprises a phase locked loop that is responsive to the modulated signal. The phase locked loop includes a controlled oscillator having a controlled oscillator output that produces the phase signal.

In other embodiments, the amplitude tracking system includes an automatic gain control subsystem that is responsive to the modulated signal to produce the amplitude signal. In some embodiments, the automatic gain control subsystem comprises a first envelope detector that is responsive to the modulated signal, a second envelope detector that is responsive to the phase locked loop and a comparator that is responsive to the first and second envelope detectors to produce the amplitude signal. In yet other embodiments, the automatic gain control subsystem comprises a first envelope detector that is responsive to the modulated signal, a second envelope detector that is responsive to the amplifier and a comparator that is responsive to the first and second envelope detectors to produce the amplitude signal. In still other embodiments, the amplitude tracking system comprises an envelope detector that is responsive to the modulated signal to produce the amplitude signal.

In still other embodiments, the phase tracking system comprises a phase locked loop that is responsive to the modulated signal. The phased lock loop includes a controlled oscillator having a controlled oscillator input and a controlled oscillator output that produces the phase signal. The phase locked loop also includes a feedback loop between the controlled oscillator input and the controlled oscillator output. The feedback loop includes a mixer that is responsive to a local oscillator. The modulator is placed in the phase locked loop. In some embodiments, the modulator is placed in the feedback loop between the controlled oscillator output and the mixer, between the local oscillator and the mixer, or between the mixer and the controlled oscillator input. Accordingly, the modulation may take place within the feedback loop in addition to taking place before the phase locked loop.

In all of the above-described embodiments, an optional power amplifier may be included that is responsive to the output of the amplifier having a signal input, an amplitude control input and an output. Alternatively, a power amplifier itself may have the signal input, the amplitude control input and the output. A transmit antenna is responsive to the amplifier or power amplifier.

Moreover, in all of the above-described embodiments, the amplifier may include a variable gain amplifier and/or a power amplifier, at least one of which includes an amplitude control input that is responsive to the amplitude signal. When both a variable gain amplifier and a power amplifier are used, the variable gain amplifier may precede the power amplifier or the power amplifier may precede the variable gain amplifier, regardless of which one includes the amplitude control input. Additional variable gain amplifiers and/or power amplifiers also may be included in the amplifier.

Finally , a user interface may be provided that generates the baseband signal or the in-phase and quadrature-phase signals in response to user input to provide a wireless communications terminal such as a radiotelephone.

BRIEF DESCRIPTION OF THE DRAWINGS

FIGS. 1–3 are block diagrams of conventional IQ modulators; and

FIGS. 4–22 are block diagrams of IQ modulation systems and methods according to embodiments of the present invention.

DETAILED DESCRIPTION OF THE PREFERRED EMBODIMENTS

Figure 1:
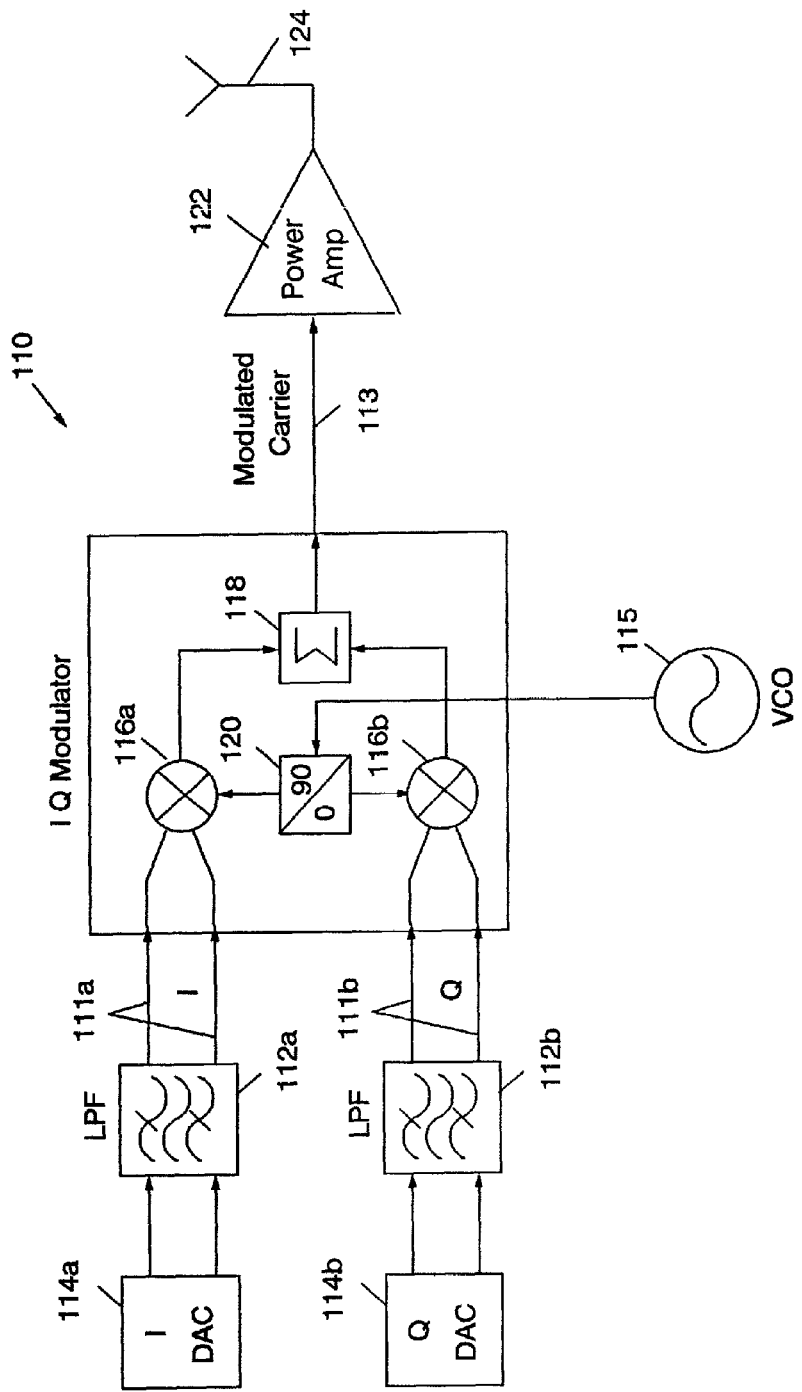

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. It will be understood that when an element is referred to as being "between" other elements, it can be directly between the other elements or intervening elements may also be present. In contrast, when an element is referred to as being "directly between" other elements, there are no intervening elements present.

Embodiments of the present invention stem from a realization that potential shortcomings of the systems of FIGS. 2 and 3 may arise from the two mixing (heterodyning)

operations that are performed. In particular, a frequency mixing occurs in the up-conversion mixer 214 and in the IQ modulator 204 which may include two double balanced mixers. The frequency mixing may inherently generate high spurious levels and/or noise. Moreover, while some spurious levels far from the transmit carrier can be attenuated by the filters 206, 216 and 224, other levels may be within the allowed transmission band of the transmitter and may not be filtered. Moreover, the amount of filtering to reduce the output noise and spurious levels may exceed that which can be achieved with a single RF filter. Thus, multiple filters may need to be placed in the modulator. This also can add cost and/or space to the system. Finally, in order to reduce distortion of the modulated signal (information plus the carrier) and to meet transmit voice quality needs, the up-conversion mixer 214, the IQ modulator 204 and the variable gain amplifier 222 may run at high current levels, which can reduce the operating time and generate excessive heat for portable wireless communication terminals.

Embodiments of the present invention can reduce the output noise and/or spurious levels so that the need for additional filters may be reduced and preferably may be eliminated. Moreover, the current consumption of an IQ modulator can be reduced while still meeting a desired linearity.

Referring now to FIG. 4, modulation systems and methods according to embodiments of the present invention are shown. As shown in FIG. 4, these embodiments of modulation systems and methods 400 include a quadrature (IQ) modulator 420 that modulates in-phase and quadrature-phase signals, referred to as I-data and Q-data, that may be generated by a user interface 410 in response to user commands, to produce a modulated signal 422. A phase tracking subsystem 430 is responsive to the quadrature modulator 420 to produce a phase signal 432 that is responsive to phase changes in the modulated signal 422 and that is independent of amplitude changes in the modulated signal 422. An amplitude tracking subsystem 440 also is included that is responsive to the modulator 420 to produce an amplitude signal 442 that is responsive to amplitude changes in the modulated signal and that is independent of phase changes in the modulated signal 422. An amplifier 450 includes a signal input, an amplitude or gain control input and an output. The signal input is responsive to the phase signal 432. The amplitude control input is responsive to the amplitude signal 442 and the output is applied to a transmit antenna 470, optionally via a power amplifier 460. Alternatively, the amplifier 450 may be a power amplifier.

Figure 5:
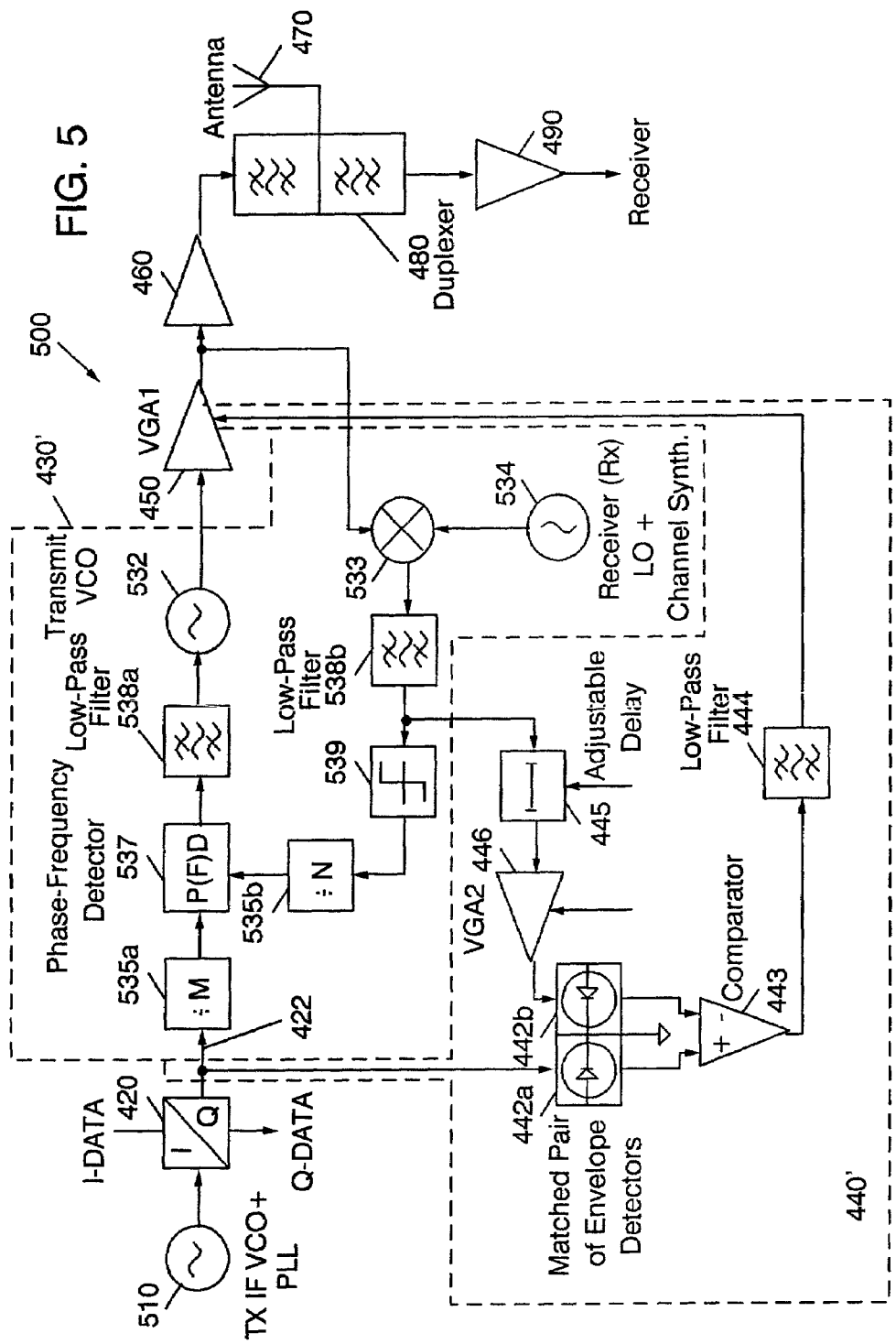

Referring now to FIG. 5, other modulation systems and methods according to embodiments of the present invention are shown. As shown in FIG. 5, these modulation systems and methods 500 include an IQ modulator 420, a phase tracking subsystem 430', an amplitude tracking subsystem 440', an amplifier 450, a power amplifier 460 and an antenna 470. As shown, the transmitter carrier frequency is generated using a fundamental radio frequency controlled oscillator such as a voltage controlled oscillator 532 which can have an extremely high signal-to-noise ratio, on the order of −165 dBc/Hz at 45 MHz away. The output signal level is controlled using an amplifier 450 such as a saturated variable gain amplifier. The information signal (I-data and Q-data) is first modulated on an IF signal using the IQ modulator 420. The IF signal is generated by a separate fundamental controlled oscillator such as a voltage controlled oscillator 510. The modulated signal then is provided to separate amplitude and phase tracking subsystems in the form of amplitude and phase tracking loops 440' and 430', respectively. The modulated IF signal 422 acts as a reference for amplitude and phase comparators in the two corresponding tracking loops 440' and 430'. The RF output signal from the amplifier 450 is mixed down to the IF frequency using a system local oscillator 534. The VCO 532 is phase locked using the phase locked loop that includes dividers 535a, 535b, a phase-frequency detector or a phase detector 537, a pair of low pass filters 538a and 538b, and a limiter 539. This phase locked loop acts as the channel synthesizer for the transmitter. The output of the mixer 533 is low pass filtered via low pass filter 538b and fed to the limiter 539 along with the modulated reference IF signal 534.

In the phase tracking loop 430', optional RF dividers 535a and 535b are placed in the reference and compare arms of the phase-frequency detector 537 to divide by M and N respectively. Since practical implementation of phase-frequency detectors at high frequencies may be difficult, this can allow for the lowering of the comparison frequency and can have negligible effect on the phase comparison. It also will be understood that the dividers 535a and 535b may be set such that M=N, or M=N=1, or may be eliminated.

In the amplitude-tracking loop 440', a pair of matched envelope detectors 442a and 442b are used to compare the amplitude level of the down-converted IF signal or other signal from the phase locked loop to that of the modulated signal 422. Good matching between the two envelope detectors 442a and 442b may be provided to reduce AM offsets in the loop. Also, an adjustable constant delay element 445 may be introduced in the amplitude tracking loop 440' to match the total group delay for the amplitude and phase signals. If the total delay is not matched, the output signal may not have the desired modulation characteristics.

Since the output power level of the transmitter is controlled by the amplifier 450 (VGA1) over a wide range, the total loop gain may change for the amplitude and phase tracking loops. In the phase tracking loop, the limiter 539 and/or the limiting action of the phase detector 537 can maintain constant loop gain, while in the amplitude tracking loop 440', a separate variable gain amplifier 446 (VGA2) with the opposite gain versus control voltage slope as the amplifier 450 is used. As the gain of VGA1 450 is reduced to reduce output signal level, the gain of VGA2 446 may be increased by the same amount to keep the signal level into the matched envelope detectors 442a, 442b nearly constant. Otherwise, the envelope detectors 442a, 442b may need to have good matching over a very large (>50 dB) range of signal levels at the input. Such wide dynamic range envelope detectors may be difficult to implement. One additional potential advantage of embodiments of FIG. 5 is that the AM/PM distortion in VGA1 450 is compensated in the phase tracking loop 430'. This can help achieve low phase and amplitude error over a wide range of output power levels.

The output signals of the phase and amplitude detectors are filtered using low-pass filters 538a, 444 which can have bandwidths large enough to pass the modulation signal (baseband) but narrow enough to suppress noise and spurious levels outside the modulation bandwidth. In effect, the low-pass filters 538a, 538b and 444 in the phase and amplitude tracking loops 440' and 430' can act as bandpass filters on the RF transmit carrier signal with very narrow bandwidth (i.e., very high-Q). For example, for 30 kHz modulation bandwidth (common to digital wireless phones), the low-pass filter bandwidth can be less than 1 MHz. Therefore, the low-pass filter in the loop can be equivalent to a bandpass filter centered at the transmit frequency (e.g., 825 MHz) having a bandwidth of less than 1 MHz (Q>825).

The noise and spurious levels outside the 1 MHz bandwidth around the carrier are attenuated according to the attenuation characteristics of the low-pass filters in the tracking loops. Such low-pass filters can be implemented with resistors and capacitors, and thus can eliminate the need for expensive, multiple SAW filters.

Direct amplitude modulation of power amplifiers (especially saturated class-D power amplifiers) may be known. Some embodiments of the invention can provide electrical isolation between the modulation loop and the antenna. For example, embodiments of FIG. 5 can utilize the power amplifier 460 as an isolator providing electrical isolation between the antenna 470 and the transmit modulator. In this case, the efficiency of the amplifier (VGA1) 450 may not be as important to the overall power consumption. Therefore, it can be easier to implement simultaneous AM modulation and large power control range in VGA1. The amplifier 450 can be designed to operate in a fixed high-efficiency, linear mode without the need for dynamic bias adjustment. Alternatively, other embodiments can amplitude modulate the power amplifier itself. This can provide enhanced linearity margin and/or enhanced efficiency by utilizing a saturating power amplifier and restoring envelope amplitude through modulation of its supply.

Figure 6:
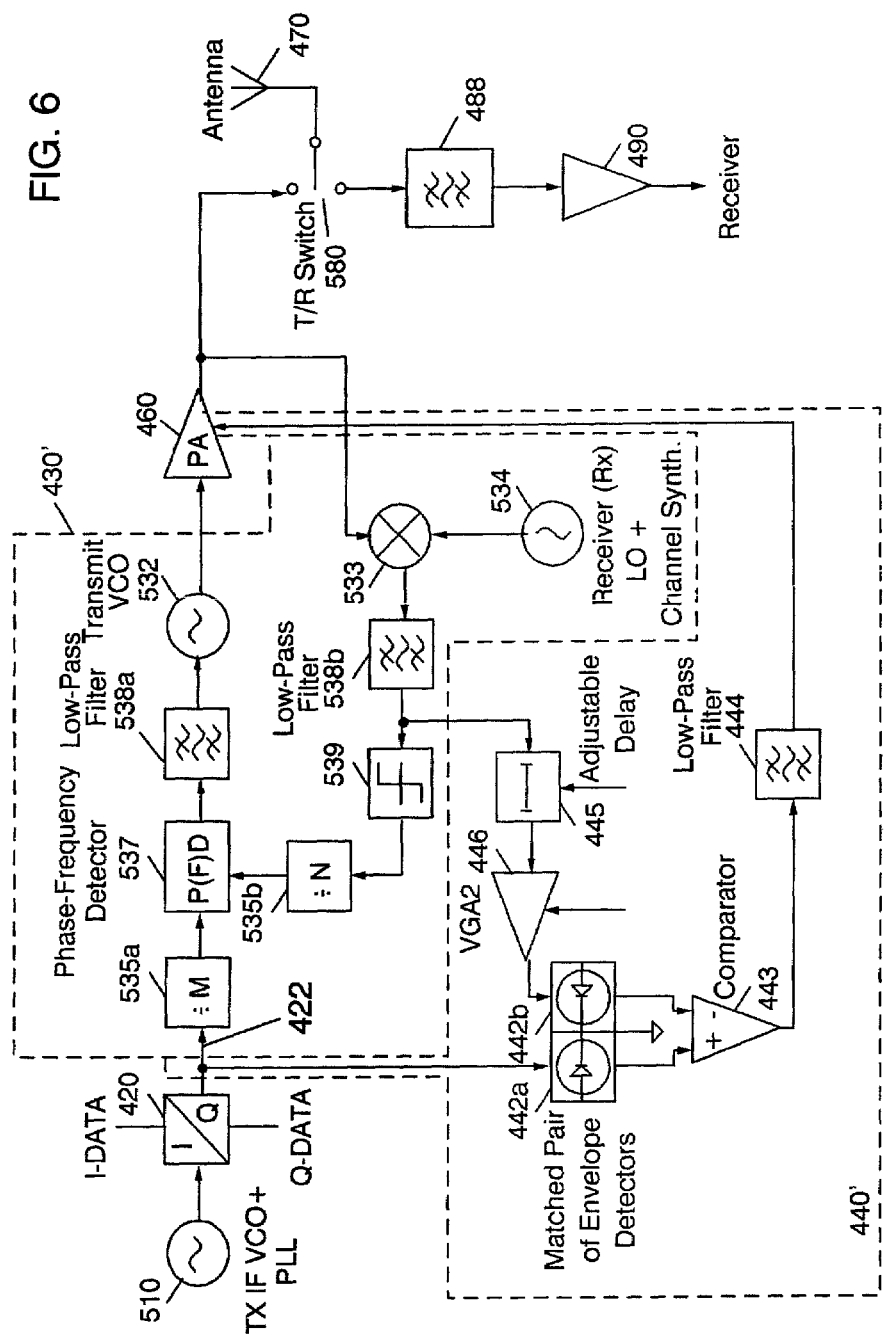

FIG. 6 depicts embodiments of the present invention in a half-duplex system such as a TDMA-only IS-136 terminal or an EDGE terminal. In this case, the signal-to-noise ratio of the transmitter can be high enough so that the duplexer filter 480 of FIG. 5 can be replaced by a transmit-receive (T/R) switch 580 in the transmit path. Also in FIG. 6, the power amplifier 460 itself is amplitude modulated.

It also will be understood by those having skill in the art that in FIGS. 5 and 6, the input to the mixer 533 may be taken between the VCO 532 and the amplifier 450 rather than between the output of the amplifier 450 and the power amplifier 460 as illustrated.

Figure 7:
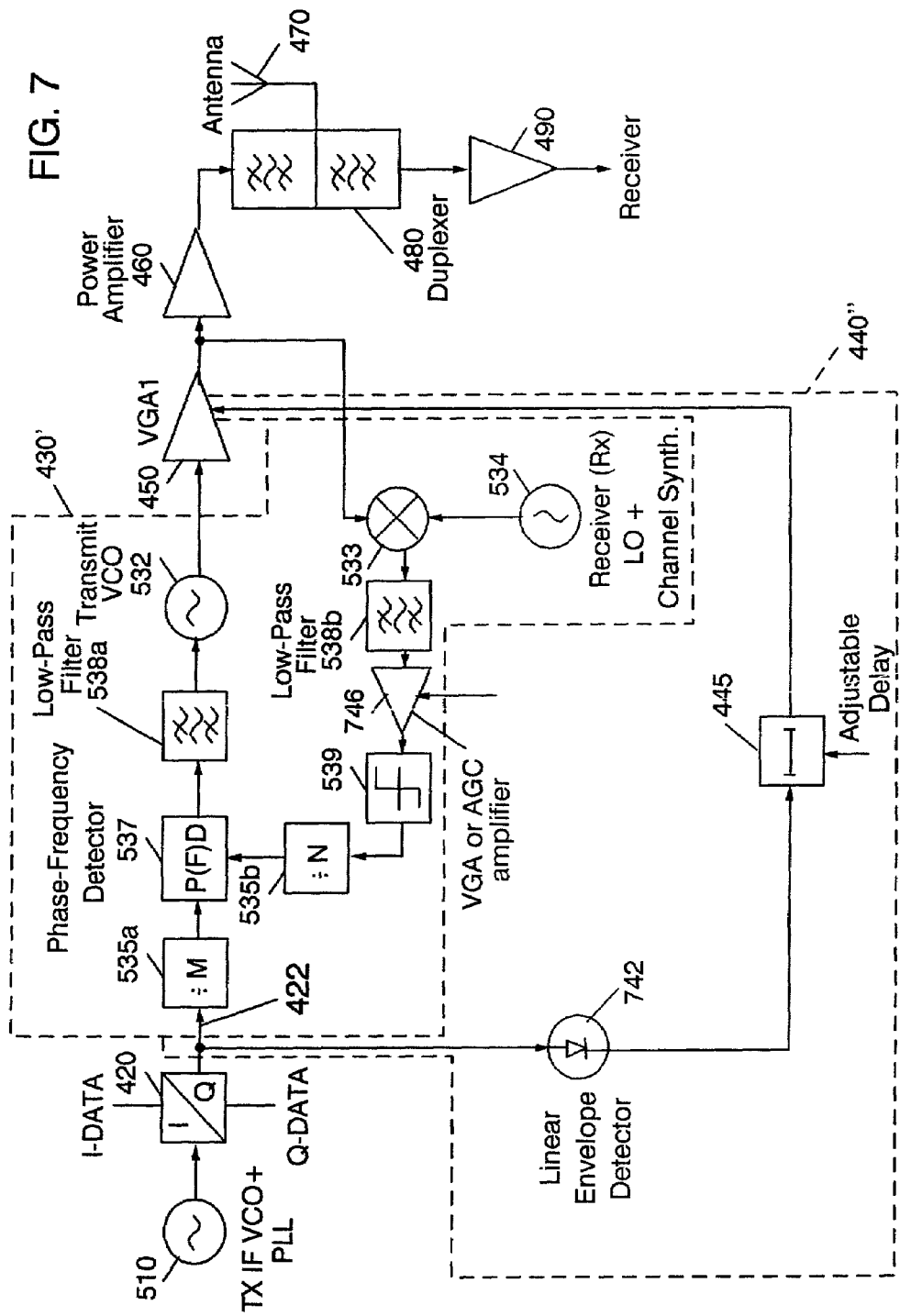

FIG. 7 is a block diagram of other modulation systems and methods according to embodiments of the invention. In these embodiments, the amplitude tracking subsystem 440" is implemented as a direct modulation or an open loop. This may be accomplished, for example, if an amplifier 450 having a linear voltage control characteristic is used. Such a circuit is feasible with integrated circuit design techniques. For embodiments of FIG. 7, the divide ratio of the phase locked loop is one so that M and N are set to 1 or no dividers 535a, 535b are used. The IF amplifier 746 after the down-converting mixer 533 can be either a variable gain amplifier or an AGC amplifier. This amplifier 746 may be used in order to reduce the input operating range of the limiter 539. The AM/PM distortion of the limiter 539 thereby can be reduced. In FIG. 7 the amplitude tracking subsystem 440" includes an envelope detector 742 such as a diode and an adjustable delay 445.

Figure 8:
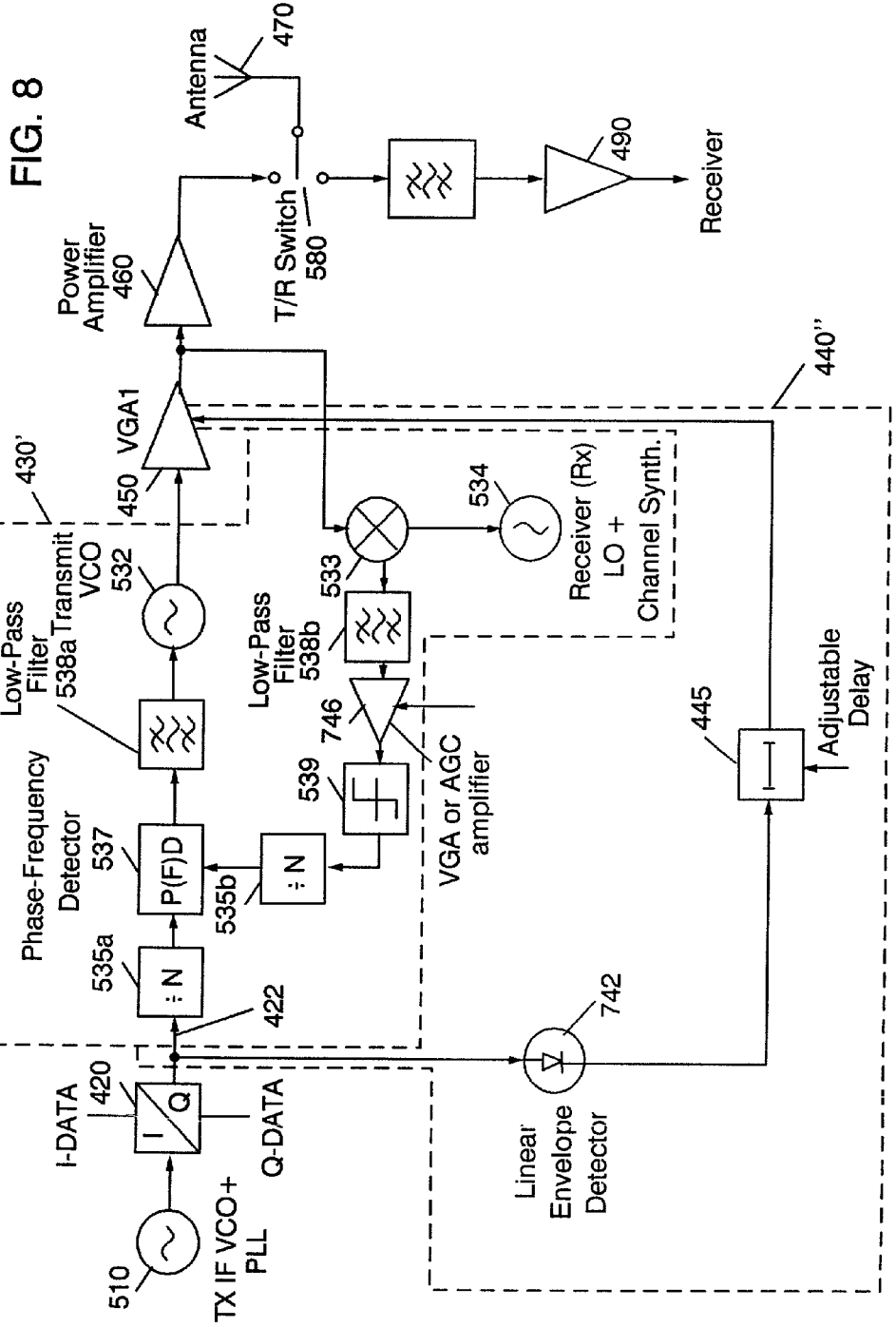

FIG. 8 depicts embodiments that can be used in a half-duplex system such as a TDMA-only IS-136 terminal or an EDGE terminal. In FIG. 8, the signal-to-noise ratio of the transmitter can be high enough so that the duplexer filter 480 can be replaced by a transmit-receive (T/R) switch 580 in the transmit path that couples to a receiver amplifier 490.

It will be understood that if the phase-frequency detector 537 is difficult to implement as a low current standard integrated circuit solution then a standard active analog phase detector such as a Gilbert cell mixer can be used. Assisted acquisition techniques then may be used to provide fast lock times for the PLL.

Figure 9:
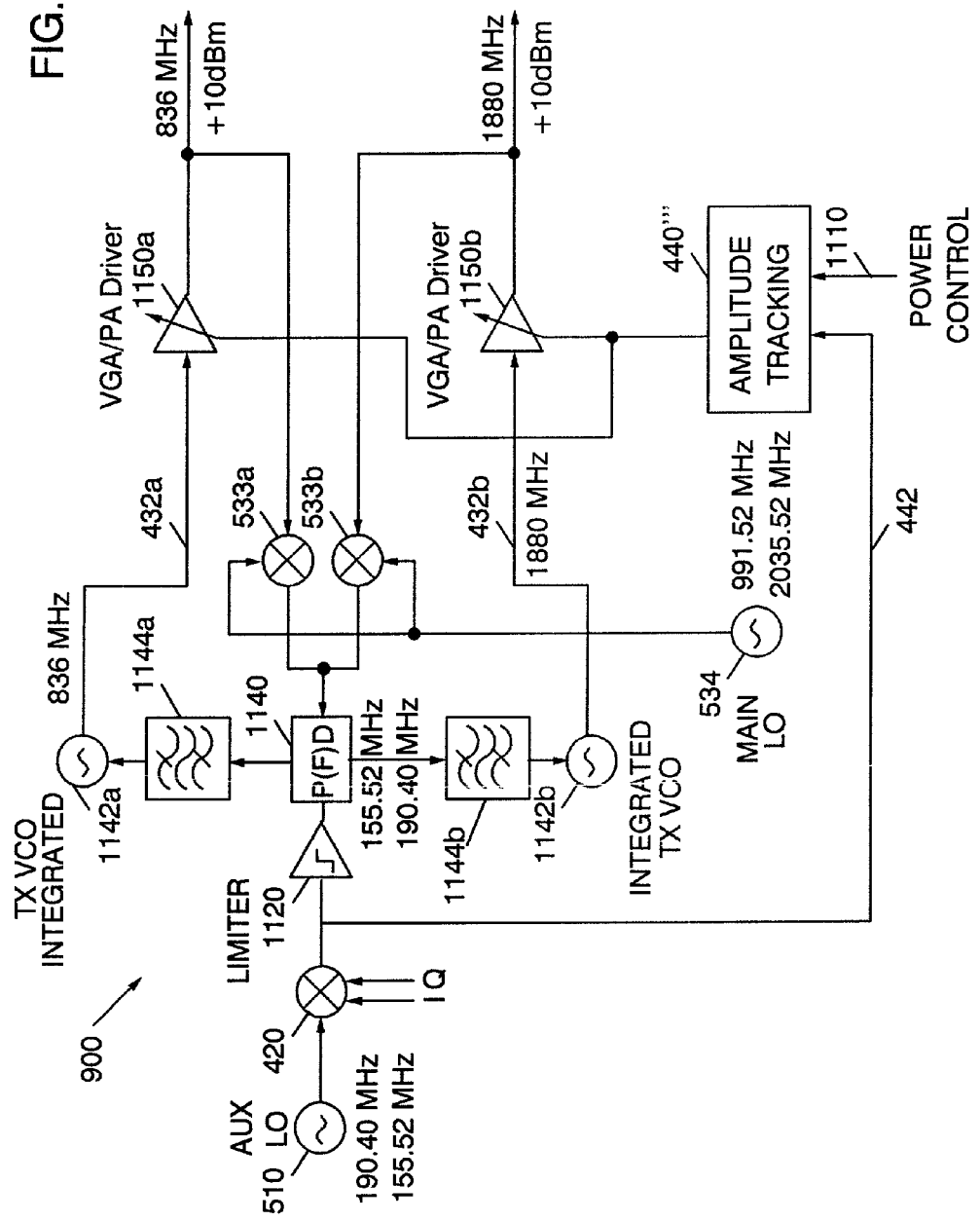

FIG. 9 is a block diagram of modulation systems and methods according to other embodiments of the present invention. FIG. 9 illustrates dual mode modulation systems and methods 900 that can produce cellular and PCS signals. As shown in FIG. 9, a phase locked loop includes phase frequency detector or phase detector 1140 and a low pass filter 1144a, 1144b and a controlled oscillator such as a VCO 1142a, 1142b for each mode. A main local oscillator 534 and a pair of mixers 533a, 533b also are provided. An amplitude tracking subsystem 440''' also may be responsive to a power control signal 1110. A pair of variable gain amplifiers and/or power amplifiers 1150a, 1150b may be provided. A limiter 1120 also is provided between the modulator 420 and the phase frequency detector 1140.

In summary, embodiments of FIGS. 4–9 can deliver low-distortion complex modulation signals containing both amplitude and phase information, with very high signal-to-noise ratio (for example on the order of −165 dBc/Hz at 45mHz offset) to a power amplifier. These embodiments can reduce or eliminate the need for SAW filters that are traditionally used in conventional digital radio transmitter architectures. They also can reduce power consumption and spurious products compared to the conventional up-mixing transmitters.

Referring now to FIG. 10, a block diagram of other embodiments of modulation systems and methods according to the present invention is shown. As shown in FIG. 10, these modulation systems and methods 1000 include a Digital Signal Processor (DSP) 920 that generates in-phase (I), quadrature-phase (Q) and amplitude (A) signals 922, 924 and 926, respectively, from a baseband signal 912 that may be generated by a user interface 910. A modulator such as an IQ modulator 930 modulates the in-phase and quadrature-phase signals 922 and 924, respectively, to produce a modulated signal 932. A phase locked loop 940 is responsive to the modulated signal. The phase locked loop 940 includes a controlled oscillator 942 having a controlled oscillator output 944. An amplifier 950 includes a signal input, an amplitude or gain control input and an output. The signal input is responsive to the controlled oscillator output 944 and the amplitude control input is responsive to the amplitude signal 926. An optional power amplifier 960 is responsive to the output of the amplifier 950. A transmit antenna is responsive to the power amplifier 960 and/or amplifier 950.

Figure 11:
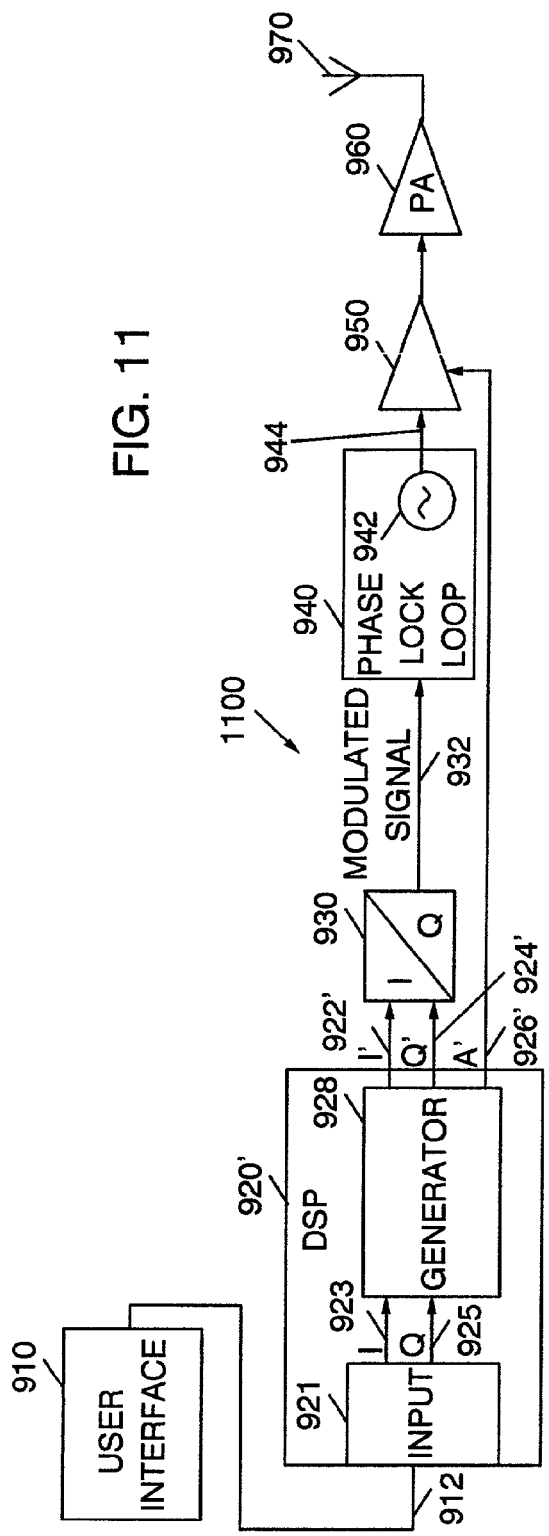

FIG. 11 illustrates other modulation systems and methods 1100 according to embodiments of the present invention. As shown in FIG. 11, the digital signal processor 920' generates in-phase I and quadrature-phase Q signals 923 and 925, respectively, from a baseband signal 912 at the input 921 thereof. A generator 928 within the digital signal processor 920' then generates normalized in-phase (I') and quadrature-phase (Q') signals 922' and 924' and a normalized amplitude signal 926'. It will be understood that the generator 928 may be embodied as a hardware and/or software module in the digital signal processor 920', and that the signals 922', 924' and 926' may be generated directly from the baseband signal 912, without the need to generate the intermediate signals 923, 925. The normalized in-phase and quadrature signals 922' and 924' are applied to a modulator such as an IQ modulator 930, such that the modulated signal 936 is of constant amplitude, followed by a phase locked loop 940, amplifier 950, optional power amplifier 960 and antenna 970 as was described in connection with FIG. 9. The normalized amplitude signal A' is applied to the gain control input of the amplifier 950.

Still referring to FIG. 11, in embodiments of the invention, the digital signal processor 920' generates the normalized in-phase signal I'922' as a cosine of an angle θ and generates the normalized quadrature-phase signal Q'924' as a sine of the angle θ, where the angle θ is an angle whose tangent is the quadrature-phase signal 925 divided by the in-phase signal 923. Moreover, the normalized amplitude signal 926' is generated as the square root of the sum of the in-phase signal I 923 squared and the quadrature-phase signal Q 925 squared. It will be understood that the sine and cosine functions may be interchanged from that which is described above.

Embodiments of FIGS. 10 and 11 can mathematically manipulate I, Q and A signals to allow reduced distortion in modulators. Conventionally, I and Q signals come from the baseband section of a wireless terminal carrying the modulating information that represents a voice and/or data signal that is to be transmitted. I and Q signals also can be represented as amplitude and phase signals. As was already described, a conventional transmitter modulates a VCO with this I and Q information and then amplifies the composite signal and up-converts the frequency to the transmit frequency. In sharp contrast, embodiments of FIGS. 10 and 11 perform numerical generation of I, Q and A signals from baseband. Moreover, embodiments of FIG. 11 generate normalized I, Q and A signals I', Q' and A', respectively, from baseband. This can eliminate the need for a limiter to inject the signals into the phase locked loop of an rTheta architecture. The amplitude signal A' may be generated numerically from baseband such that an envelope detector may not be needed for the analog reconstruction of that signal. Amplitude direct from baseband also can allow flexible phase shifting between amplitude and phase waveforms for rTheta architectures.

More particularly, conventional modulating systems, for example as illustrated in FIGS. 1, 2 and 3, generate amplitude information from the IQ signal so that the rest of the transmitter chain may need to be linear enough to meet desired modulation specifications. In contrast, if the amplifiers can be saturated instead of linear, current consumption may be reduced. Moreover, conventional modulation systems may have low levels of linearity for a given current consumption. This may be especially true for modulation schemes whose peak-to-average is not a fundamental limit and even further back-off may be needed to satisfy near channel interference levels.

Moreover, embodiments of FIG. 9 may produce an amplitude control signal 442 that may not be ideal because of distortion caused in the IQ modulator 420. The amplitude tracking circuit 440''' also may cause distortion. It also may be generally desirable to place a limiter 1120 between the IQ modulator 420 and the phase locked loop to remove unwanted amplitude information. The limiter 1120 may cause AM/PM distortion in the phase signal 432*a*, 432*b* and also can cause unwanted delay between the amplitude and phase signals when they are combined at the driver stages 1150*a* and 1150*b*.

In contrast, embodiments of FIGS. 10 and 11 can calculate a desired output for an amplitude tracking subsystem 440 (FIG. 4) and can apply this output directly. Moreover, a limiter may not be needed because limiting may already be incorporated into the generation of the I' and Q' signals.

Figure 13:
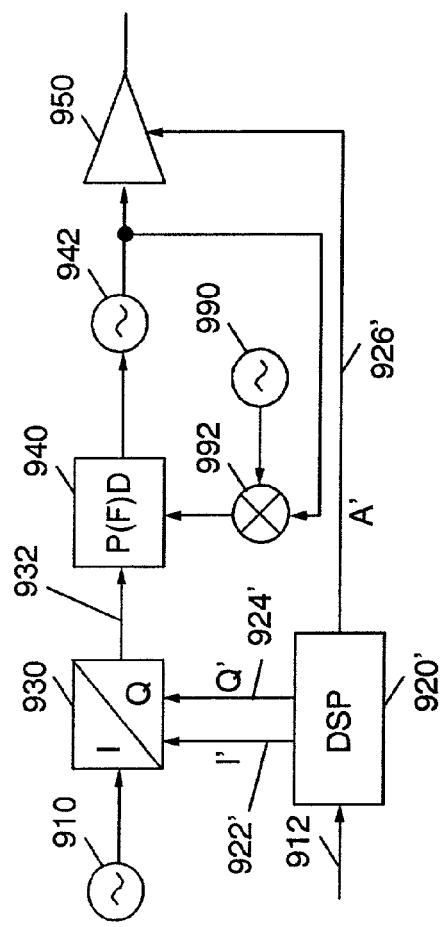
Figure 12:
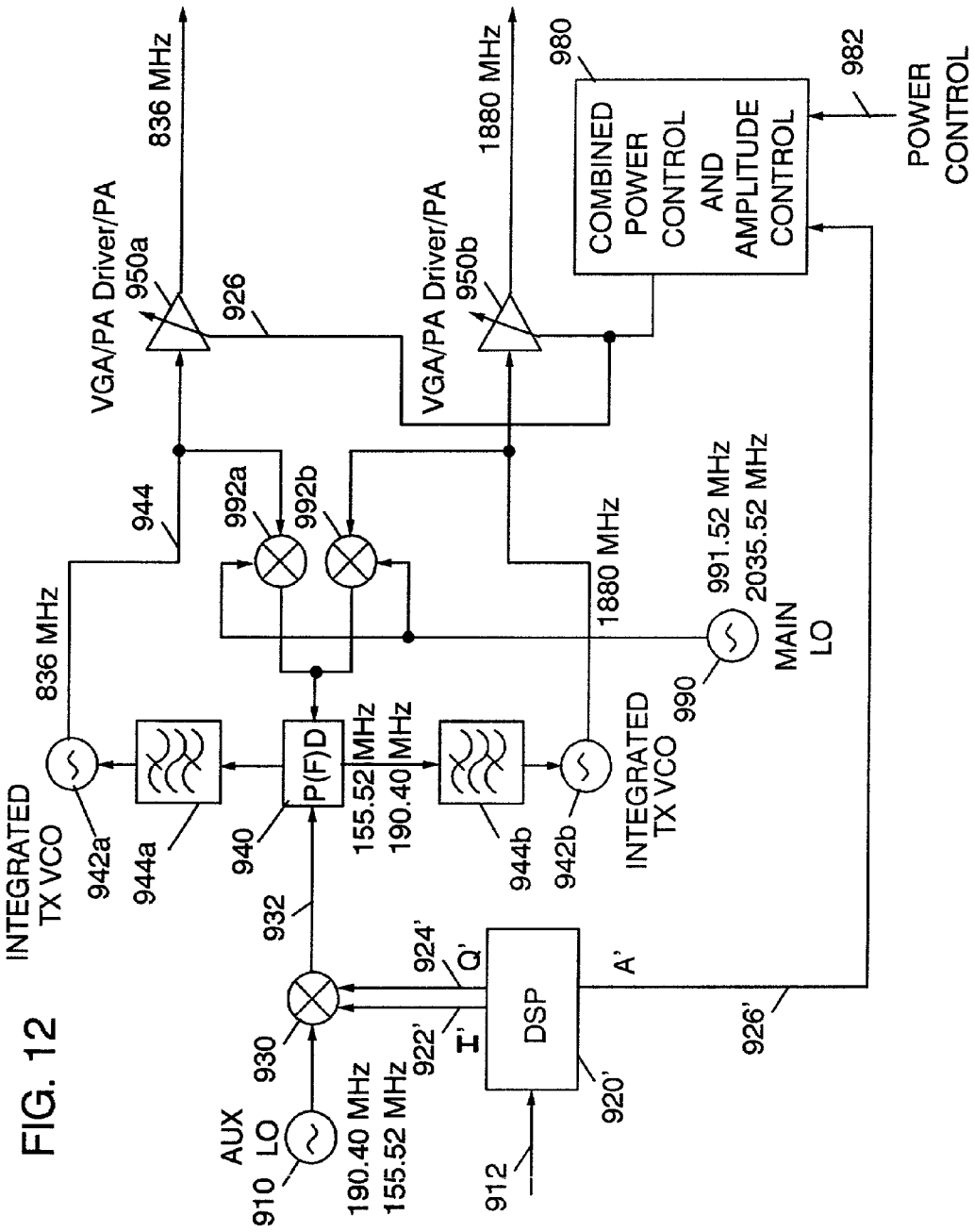

FIG. 12 is a block diagram of modulating systems and methods according to other embodiments of the present invention. As shown in FIG. 12, a DSP 920' generates an I' signal 922', a Q' signal 924' and an A' signal 926' from a baseband signal 912. A controlled oscillator 910 and the I' and Q' signals 922' and 924', respectively, are applied to an IQ modulator 930 to produce a modulated signal 932 that is applied to a phase frequency detector or phase detector 940 including a pair of low pass filters 944*a*, 944*b* and a pair of controlled oscillators 942*a*, 942*b*. Also applied to the phase frequency detector 940 is a main local oscillator 990 modulated by second modulators 992*a*, 992*b*. The output of the controlled oscillators 942*a*, 942*b* are applied to amplifiers 950*a* and 950*b*, respectively, which can be variable gain amplifiers and/or other conventional amplifiers such as power amplifiers or driver amplifiers. As also shown in FIG. 12, amplitude control also may be combined with a power control signal 982 in a combined power control and amplitude control module 980. Accordingly, an improved rTheta architecture may be provided. FIG. 13 is a block diagram of a single band version of FIG. 12.

The following equations show how the I', Q' and A' signals may be calculated for embodiments of FIGS. 11, 12 and 13:

$$\theta = \tan^{-1}\left(\frac{Q}{I}\right)$$

The angle should be a four-quadrant representation of the I and Q-data.

$$I' = \cos\theta$$

$$Q' = \sin\theta$$

The I' and Q' signals also may be interchanged. Therefore, the I' and Q' signals can be used to modulate the IF, and can create an IF that can be identical to an IQ modulated IF signal that has passed through an ideal limiter. Since the I' and Q' signals can be free of amplitude information, a limiter may not be needed at the input of the phase-frequency detector of the phase locked loop. Phase distortion, or AM/PM distortion that may occur in a real limiter, also may be reduced or eliminated.

The A' signal is calculated as follows:

$$A' = \sqrt{I^2 + Q^2}$$

Since the A' signal is calculated mathematically and applied directly to the amplifier, it need not contain any of the distortion created in the IQ modulation of the IF, and it also need not contain any distortion from the amplitude detector circuit.

Accordingly, limiters/envelope detectors may be removed and related AM/PM distortion may be reduced or eliminated. VCO pulling also may be removed that may arise from amplitude variations on a phase only signal. Sending the amplitude directly from baseband can result in exact and repeatable power control, as well as flexibility in phase shifting of amplitude relative to phase only signals in rTheta transmitters.

Embodiments of the invention that were described in FIGS. 4–13 placed the quadrature modulator prior to the phase locked loop. Thus, for example, in FIGS. 4–8, the IQ modulator 420 modulates in-phase and quadrature phase signals, and provides a modulated signal 422 to a phase locked loop in a phase tracking system 430 or 430'. Similarly, in FIGS. 10–11, the IQ modulator 930 modulates I and Q signals and provides the modulated signal 932 to a phase locked loop 940. Thus, in these embodiments, the IQ modulation may take place at the IF frequency by directly modulating the IF reference signal.

According to other embodiments that will be described below in connection with FIGS. 14–22, modulation is applied within the phase locked loop itself. In particular, the phase locked loop includes a controlled oscillator having a controlled oscillator input and a controlled oscillator output, and a feedback loop between the controlled oscillator input and the controlled oscillator output. The feedback loop includes a mixer that is responsive to a local oscillator. In some embodiments, the modulator is placed in the feedback loop between the controlled oscillator output and the mixer, between the local oscillator and the mixer, or between the mixer and the controlled oscillator input. Accordingly, the modulation can be applied by modulating a local oscillator signal and leaving the IF as an unmodulated signal. Alternatively, the modulation can be applied to the RF output, and then mixed with an unmodulated local oscillator and IF frequency. In yet another alternative, the modulation may be performed after the mixer in the feedback path of the phase locked loop if it is desired to keep the IQ modulator running at the IF frequency.

For example, FIG. 14 is similar to FIG. 4, except that the IQ modulator 420 is included within the phase tracking subsystem 430″, preferably within the feedback loop of the phase locked loop of the phase tracking subsystem 430″. FIG. 15 is similar to FIG. 10, except the IQ modulator 930 is included within the phase locked loop 940′, preferably within the feedback loop thereof.

Figure 16:
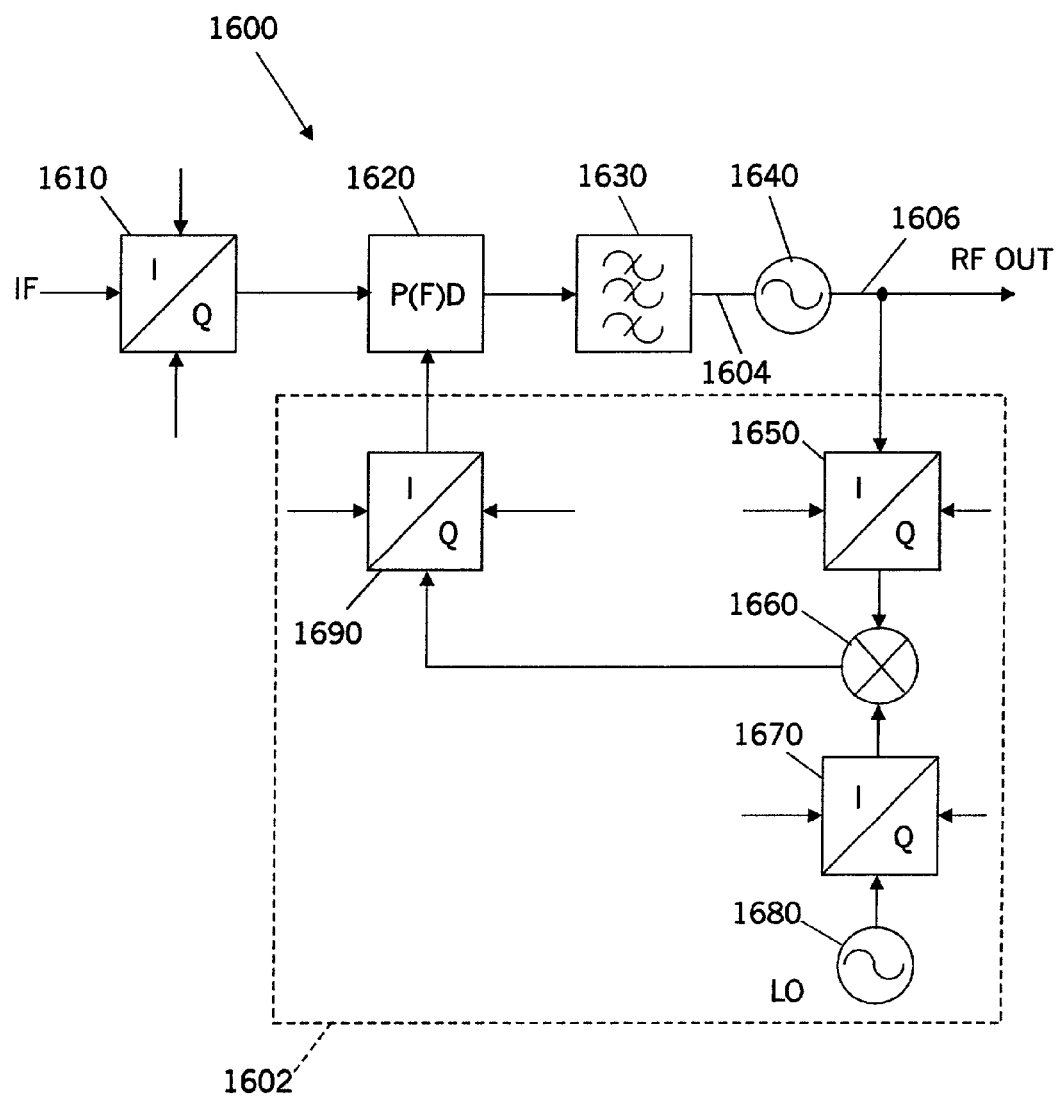

FIG. 16 is a block diagram of embodiments of the invention that illustrate various alternative locations of the IQ modulator within the phase locked loop. It will be understood that FIG. 16 can correspond to the phase tracking system 430 of FIG. 4, 430′ of FIGS. 5–8 and/or 430″ of FIG. 14, and/or the phase locked loop 940 of FIGS. 10–13, and/or 940′ of FIG. 15.

As shown in FIG. 16, the phase locked loop 1600 includes a phase detector or phase-frequency detector 1620 that can correspond to the phase-frequency detector or phase detector 537 of FIGS. 5–8, 1140 of FIG. 9 and/or 940 of FIGS. 12–13, and a low pass filter 1630 that can correspond to the low pass filter 538f FIGS. 5–8, 1144a of FIG. 9, and/or 944a of FIG. 12. A controlled oscillator, such as a Voltage Controlled Oscillator (VCO) 1640 can correspond to the VCO 532 of FIGS. 5–8, 1142a, 1142b of FIG. 9, 942a, 942b of FIG. 12 and/or 942 of FIGS. 10, 11, 13 and 15. As also shown in FIG. 16, the controlled oscillator has a controlled oscillator input 1604 and a controlled oscillator output 1606. A feedback loop 1602 is provided between the controlled oscillator output 1606 and the controlled oscillator input 1604 via the phase-frequency detector or phase detector 1620 and low pass filter 1630. The feedback loop includes a mixer 1660 that can correspond to the mixer 533 of FIGS. 5–8, 533a, 533b of FIG. 9, 922a, 922b of FIG. 12 and/or 922 of FIG. 13, and a local oscillator 1680 that can correspond to the local oscillator 534 of FIGS. 5–9 and/or 990 of FIGS. 12–13.

In FIG. 16, four possible locations of the IQ modulator corresponding to IQ modulator 420 of FIGS. 4–9 and/or 930 of FIGS. 10–13 are shown by IQ modulators 1610, 1650, 1670 and 1690. It will be understood by those having skill in the art that only one IQ modulator need be provided at only one of the positions shown in FIG. 16. However, multiple IQ modulators also may be provided.

The IQ modulator 1610 is placed prior to the phase locked loop 1600 in a manner corresponding to FIGS. 4–13 as was described extensively above. The IQ modulator 1650 is placed in the feedback loop 1602 between the controlled oscillator output 1606 and the mixer 1660. The IQ modulator 1670 is placed in the feedback loop 1602 between the local oscillator 1680 and the mixer 1660. Finally, the IQ modulator 1690 is placed in the feedback loop 1602 between the mixer 1660 and the controlled oscillator input 1604.

When the IQ modulator 1650 is placed between the output of the controlled oscillator 1606 and the mixer 1660, the RF output signal of the controlled oscillator 1640 is modulated with the I and Q signals. Thus, this is an example of RF modulation. When the IQ modulator 1690 is placed between the mixer 1660 and the controlled oscillator input 1604, this can correspond to IQ modulating at the IF frequency, but the modulation takes place in the feedback loop 1602 of the phase locked loop 1600, rather than at the IF input, as would be the case with modulator 1610. When the modulator 1670 is placed between the local oscillator 1680 and the mixer 1660, the local oscillator frequency is modulated before it is mixed with the RF to create the IF feedback signal. The phase can be preserved through the mixer, so that an analogous situation to modulating with modulator 1610 may be provided.

It will be understood by those having skill in the art that each of the four positions of the modulators 1610, 1650, 1670 and 1690 shown in FIG. 16 can provide the same result at the output. Various considerations may be used in deciding where to place the modulator. For example, it may be more efficient to IQ modulate at the IF frequency, so that modulators 1610 and 1690 may be preferred. Modulating at RF (modulator 1650) or at the local oscillator (modulator 1670) may consume more current than modulating at IF. However, the current consumption may depend on the frequency plan of the system. It also will be understood that an amplitude signal may be generated and/or applied in a manner that was described in any of the previous figures.

Figure 17:
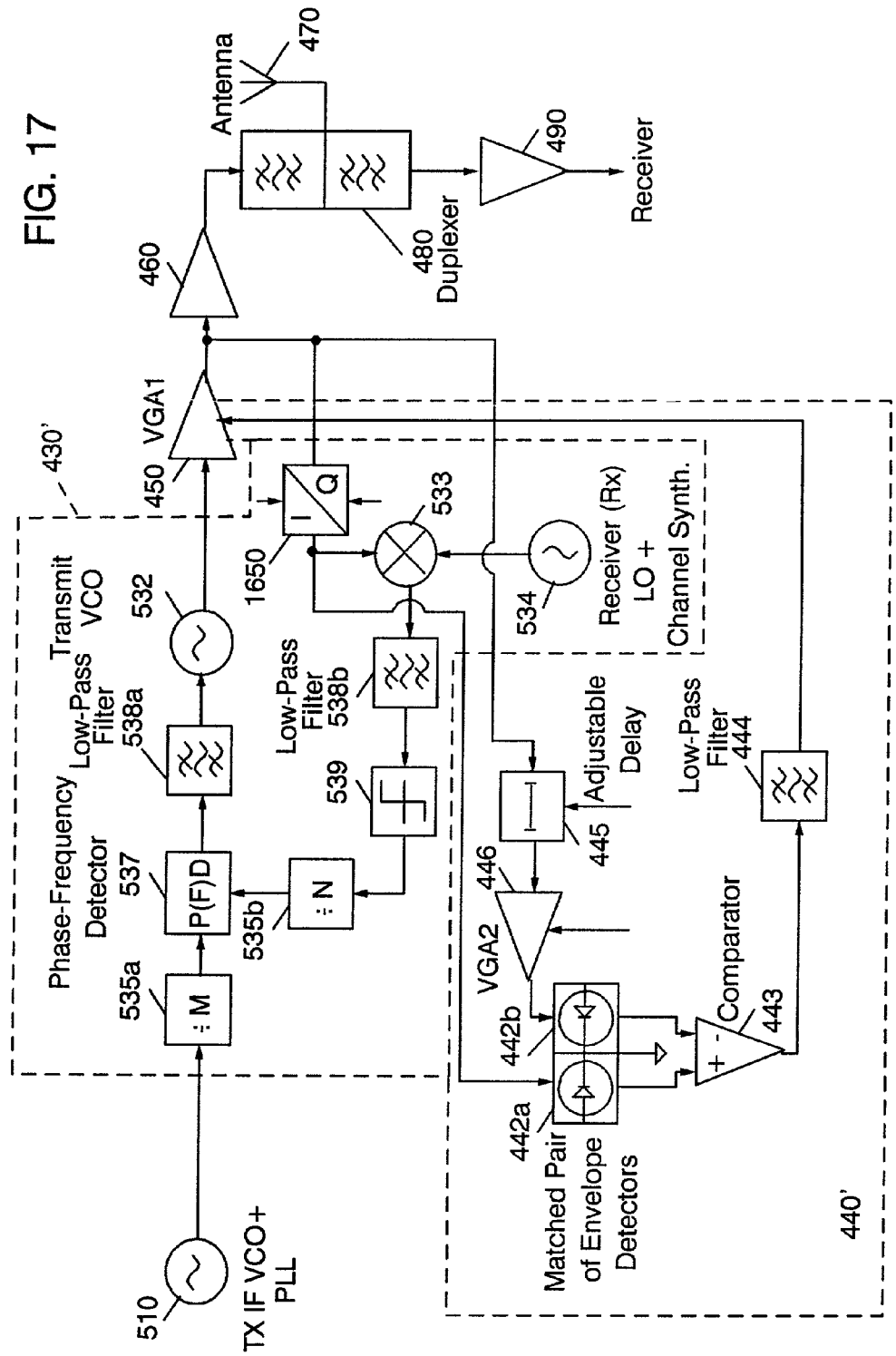

FIG. 17 is a block diagram that is similar to FIG. 5, except the IQ modulator 1650 is placed in the feedback loop between the output of the controlled oscillator 532 and the mixer 533, rather than the IQ modulator 420 of FIG. 5. An IQ modulator 1670 or 1690 of FIG. 16 also may be used in embodiments of FIG. 17.

Figure 18:
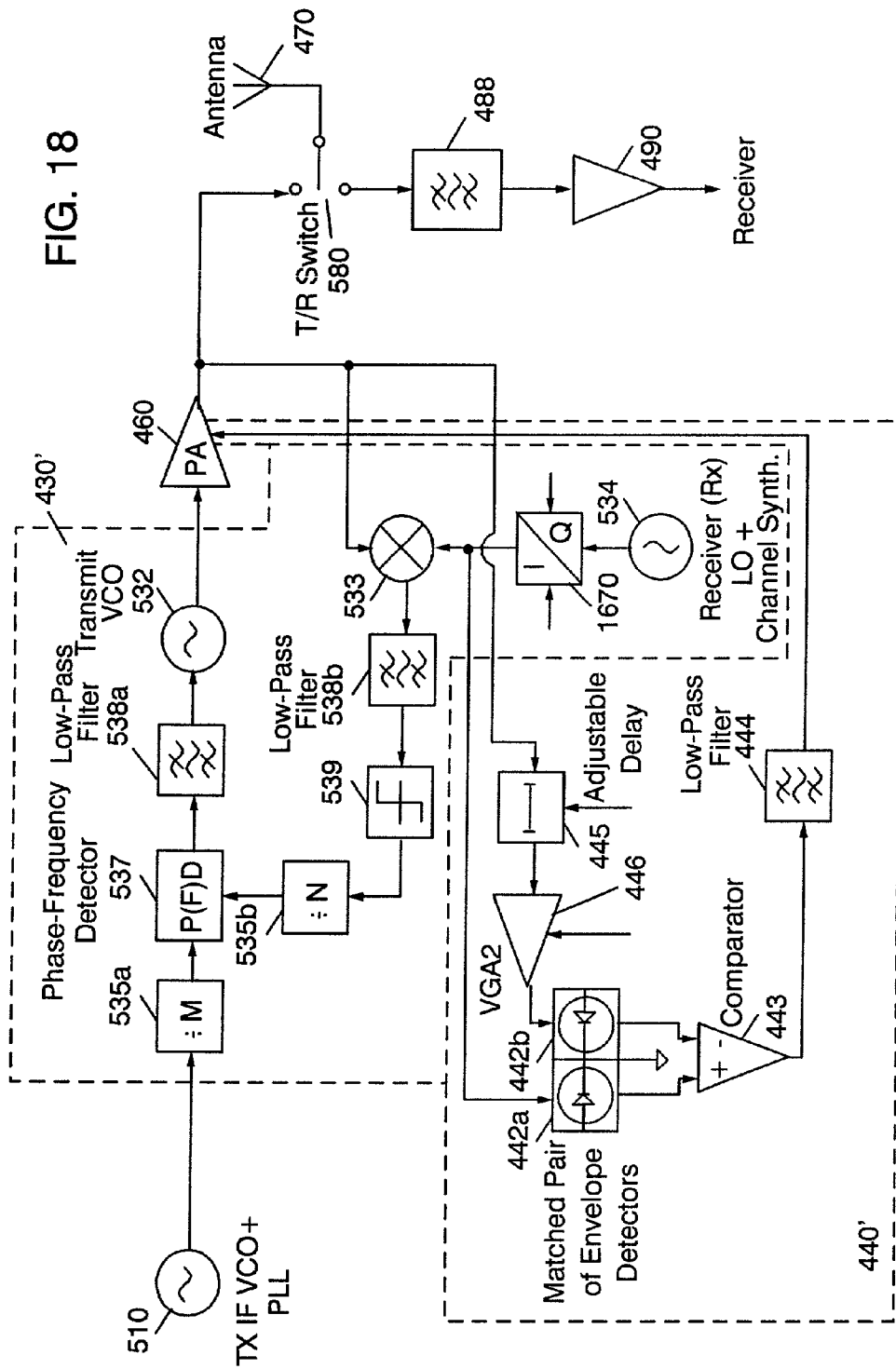

FIG. 18 illustrates the use of an IQ modulator 1670 between the local oscillator 534 and the mixer 533, instead of the IQ modulator 420 at the input of the phase locked loop in FIG. 6. It will also be understood that an IQ modulator 1650 or 1690 of FIG. 16 also may be employed.

Figure 19:
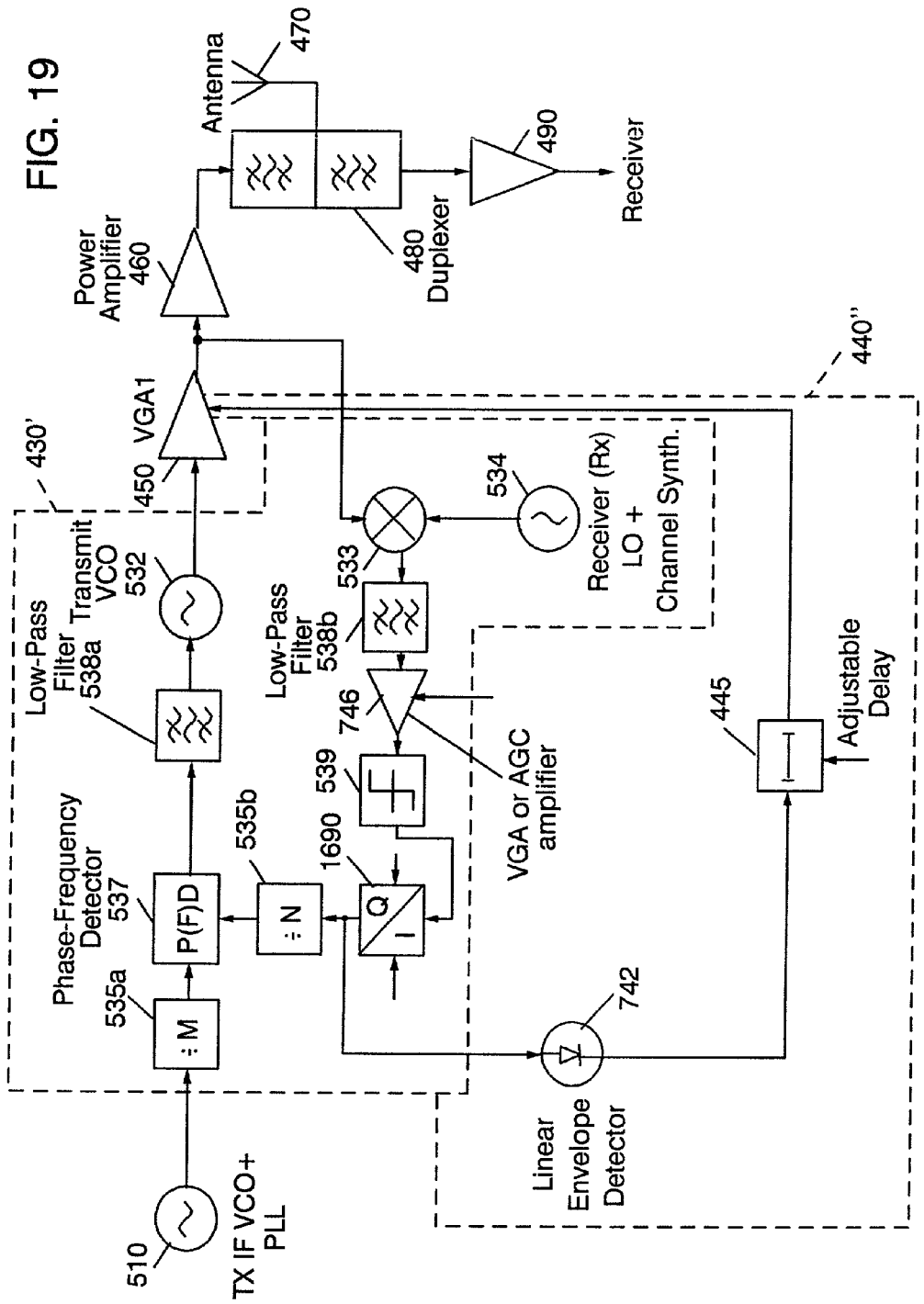

FIG. 19 illustrates the use of an IQ modulator 1690 between the mixer 533 and the input of the controlled oscillator 532, instead of the IQ modulator 420 of FIG. 7. It also will be understood that IQ modulators 1650 or 1670 also may be used. IQ modulators also may be used in the positions shown in FIG. 16 in other embodiments of the invention according to FIGS. 8 and 9.

Figure 20:
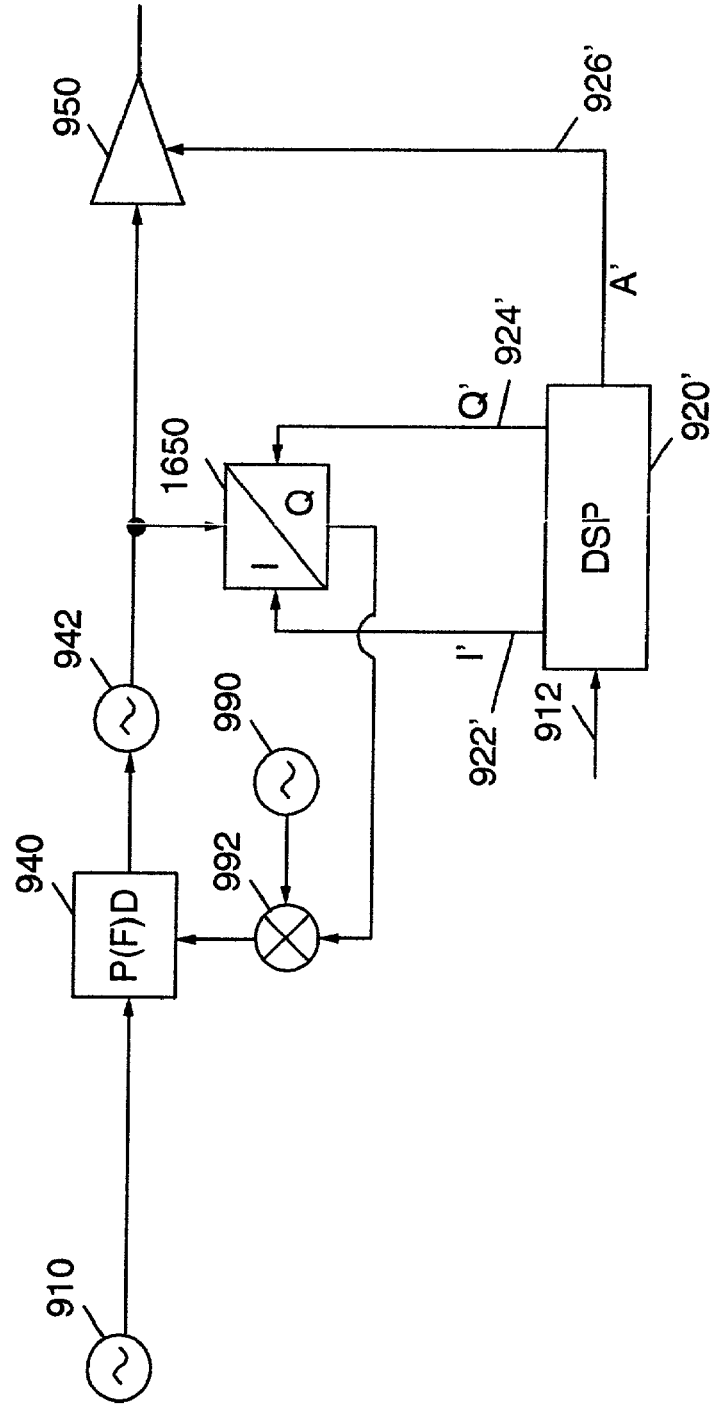
Figure 21:
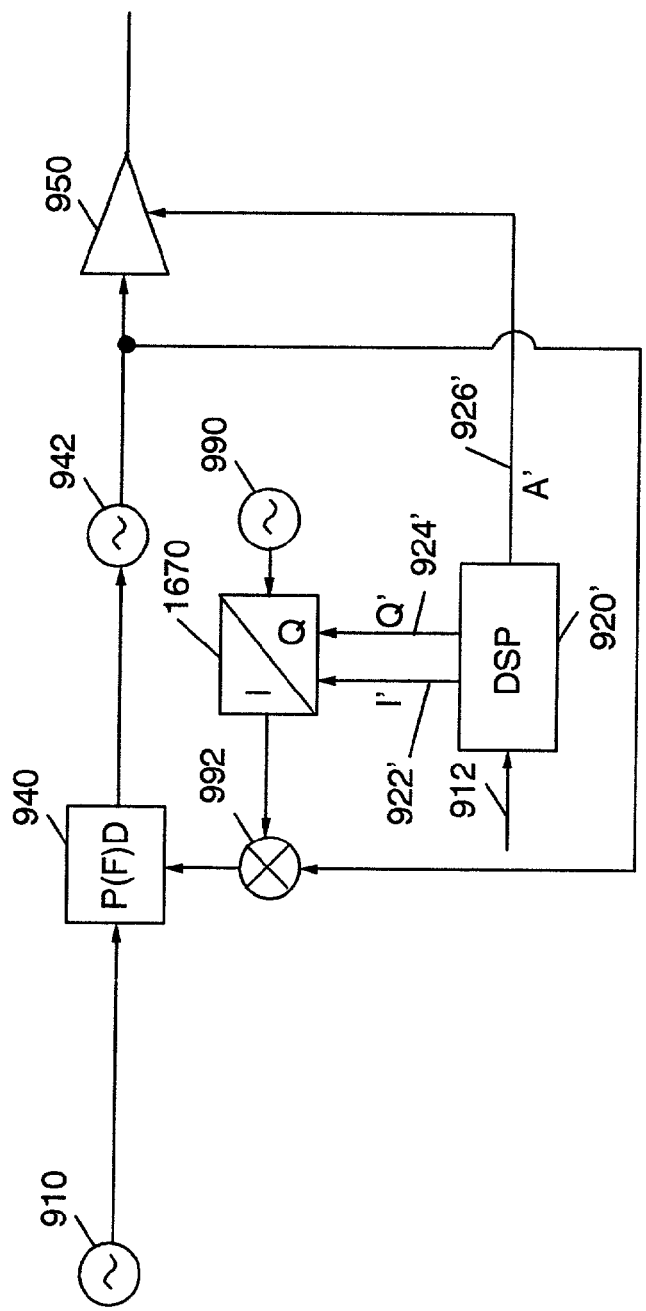
Figure 22:
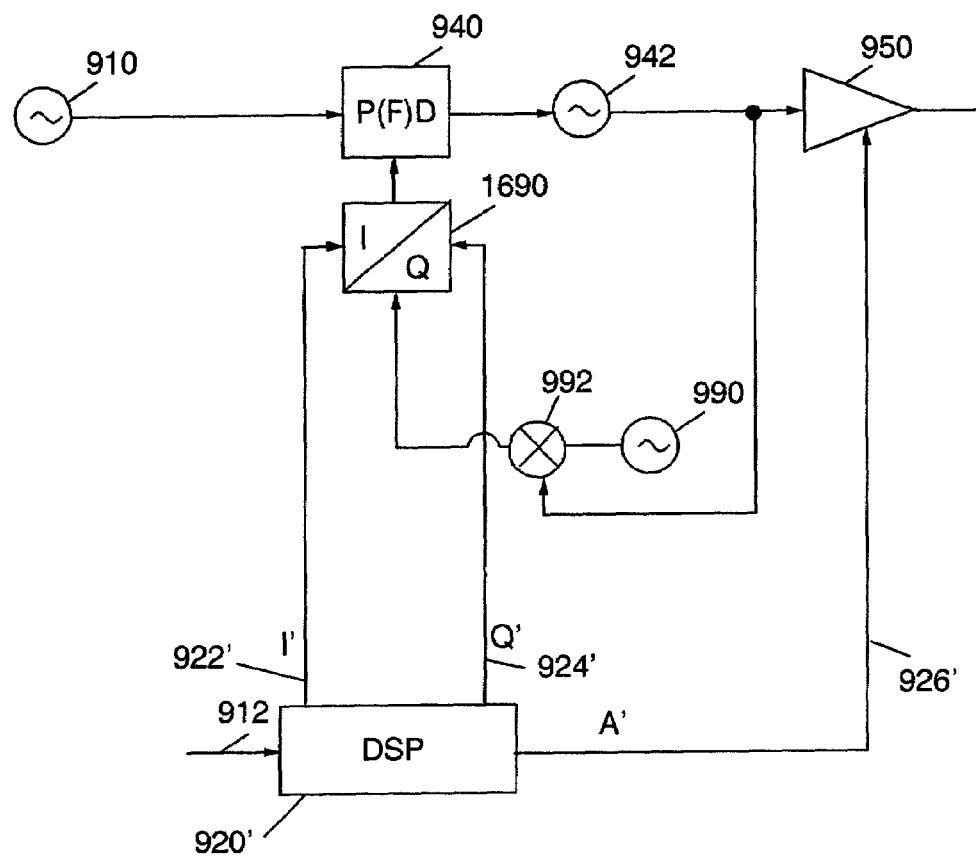

FIG. 20 illustrates the use of a modulator 1650 between the output of the controlled oscillator 942 and the mixer 992, instead of the IQ modulator 930 of FIG. 13. FIG. 21 illustrates an IQ modulator 1670 between the local oscillator 990 and the mixer 992, instead of the IQ modulator 930 of FIG. 13. FIG. 22 illustrates an IQ modulator 1690 between the mixer 992 and the input of the controlled oscillator 942, instead of the IQ modulator 930 of FIG. 13. Similar placements of the modulator may be provided for the embodiments of FIG. 12.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A modulation system comprising:
a quadrature modulator that modulates in-phase and quadrature-phase signals to produce a modulated signal;
a phase tracking subsystem that is responsive to the quadrature modulator to produce a phase signal that is responsive to phase changes in the modulated signal and that is independent of amplitude changes in the modulated signal;
an amplitude tracking subsystem that is responsive to the quadrature modulator to produce an amplitude signal that is responsive to amplitude changes in the modulated signal and that is independent of phase changes in the modulated signal; and
an amplifier having a signal input, an amplitude control input and an output, wherein the signal input is responsive to the phase signal and the amplitude control input is responsive to the amplitude signal;
wherein the phase tracking subsystem comprises a phase locked loop that includes a controlled oscillator having a controlled oscillator input, a controlled oscillator output that produces the phase signal and a feedback loop between the controlled oscillator input and the controlled oscillator output, the feedback loop including a mixer that is responsive to a local oscillator, and wherein the quadrature modulator is included within the feedback loop between the controlled oscillator output and the mixer, between the local oscillator and the mixer, or between the mixer and the controlled oscillator input.

2. A system according to claim 1 wherein the amplitude tracking subsystem comprises an automatic gain control subsystem that is responsive to the modulated signal to produce the amplitude signal.

3. A system according to claim 1 wherein the phase tracking system further comprises a limiter between the quadrature modulator and the phase locked loop.

4. A system according to claim 1 further comprising:
a power amplifier that is responsive to the output of the amplifier having a signal input, an amplitude control input and an output; and a transmit antenna that is responsive to the power amplifier.

5. A system according to claim 1 further comprising a transmit antenna that is responsive to the output of the amplifier and a user interface that generates the in-phase and quadrature signals in response to user input, to provide a wireless communications terminal.

6. A system according to claim 1 wherein the amplifier is a power amplifier.

7. A modulation system comprising:
a quadrature modulator that modulates in-phase and quadrature-phase signals to produce a modulated signal;
a phase tracking subsystem that is responsive to the quadrature modulator to produce a phase signal that is responsive to phase changes in the modulated signal and that is independent of amplitude changes in the modulated signal;
an amplitude tracking subsystem that is responsive to the quadrature modulator to produce an amplitude signal that is responsive to amplitude changes in the modulated signal and that is independent of phase changes in the modulated signal, wherein the amplitude tracking subsystem comprises an automatic gain control subsystem that is responsive to the modulated signal to produce the amplitude signal;
an amplifier having a signal input, an amplitude control input and an output, wherein the signal input is responsive to the phase signal and the amplitude control input is responsive to the amplitude signal;
wherein the phase tracking subsystem comprises a phase locked loop that includes a controlled oscillator having a controlled oscillator output that produces the phase signal and wherein the quadrature modulator is included within the phase locked loop; and
wherein the automatic gain control subsystem further comprises:
a first envelope detector that is responsive to the modulated signal;
a second envelope detector that is responsive to the phase locked loop; and
a comparator that is responsive to the first and second envelope detectors to produce the amplitude signal.

8. A modulation system comprising:
a quadrature modulator that modulates in-phase and quadrature-phase signals to produce a modulated signal;
a phase tracking subsystem that is responsive to the quadrature modulator to produce a phase signal that is responsive to phase changes in the modulated signal and that is independent of amplitude changes in the modulated signal;
an amplitude tracking subsystem that is responsive to the quadrature modulator to produce an amplitude signal that is responsive to amplitude changes in the modulated signal and that is independent of phase changes in the modulated signal, wherein the amplitude tracking subsystem comprises an automatic gain control subsystem that is responsive to the modulated signal to produce the amplitude signal;
an amplifier having a signal input, an amplitude control input and an output, wherein the signal input is responsive to the phase signal and the amplitude control input is responsive to the amplitude signal;
wherein the phase tracking subsystem comprises a phase locked loop that includes a controlled oscillator having a controlled oscillator output that produces the phase signal and wherein the quadrature modulator is included within the phase locked loop
wherein the automatic gain control subsystem further comprises:
a first envelope detector that is responsive to the modulated signal;
a second envelope detector that is responsive to the amplifier; and
a comparator that is responsive to the first and second envelope detectors to produce the amplitude signal.

9. A modulation system comprising:
a quadrature modulator that modulates in-phase and quadrature-phase signals to produce a modulated signal;
a phase tracking subsystem that is responsive to the quadrature modulator to produce a phase signal that is responsive to phase changes in the modulated signal and that is independent of amplitude changes in the modulated signal;
an amplitude tracking subsystem that is responsive to the quadrature modulator to produce an amplitude signal that is responsive to amplitude changes in the modulated signal and that is independent of phase changes in the modulated signal;
an amplifier having a signal input, an amplitude control input and an output, wherein the signal input is responsive to the phase signal and the amplitude control input is responsive to the amplitude signal;

wherein the phase tracking subsystem comprises a phase locked loop that includes a controlled oscillator having a controlled oscillator output that produces the phase signal and wherein the quadrature modulator is included within the phase locked loop; and wherein the amplitude tracking subsystem further comprises an envelope detector that is responsive to the modulated signal to produce the amplitude signal.

10. A modulation method comprising:

modulating in-phase and quadrature signals to produce a modulated signal;

producing a phase signal from the modulated signal that is responsive to phase changes in the modulated signal and that is independent of amplitude changes in the modulated signal using a phase locked loop that includes a controlled oscillator having a controlled oscillator input, a controlled oscillator output and a feedback loop between the controlled oscillator input and the controlled oscillator output, the feedback loop including a mixer that is responsive to a local oscillator, wherein the modulating is performed in the feedback loop between the controlled oscillator output and the mixer, between the local oscillator and the mixer, or between the mixer and the controlled oscillator input;

producing an amplitude signal from the modulated signal that is responsive to amplitude changes in the modulated signal and that is independent of phase changes in the modulated signal; and amplifying the phase signal at a gain that is varied in response to the amplitude signal.

11. A method according to claim 10 wherein the producing an amplitude signal from the modulated signal comprises automatic gain controlling the modulated signal to produce the amplitude signal.

12. A method according to claim 10 further comprising limiting the modulated signal, and wherein the applying the modulated signal to a phase locked loop comprises applying the limited modulated signal to a phase locked loop that includes a controlled oscillator having a controlled oscillator output that produces the phase signal.

13. A method according to claim 10 further comprising: transmitting the amplified phase signal.

14. A method according to claim 13 further comprising: generating the in-phase and quadrature signals in response to user input, to provide a wireless communications method.

15. A modulation method comprising:

modulating in-phase and quadrature signals to produce a modulated signal;

producing a phase signal from the modulated signal that is responsive to phase changes in the modulated signal and that is independent of amplitude changes in the modulated signal using a phase locked loop that includes a controlled oscillator having a controlled oscillator output, wherein the modulating is performed within the phase locked loop;

producing an amplitude signal from the modulated signal that is responsive to amplitude changes in the modulated signal and that is independent of phase changes in the modulated signal;

amplifying the phase signal at a gain that is varied in response to the amplitude signal;

wherein the producing an amplitude signal from the modulated signal comprises automatic gain controlling the modulated signal to produce the amplitude signal; and wherein the automatic gain controlling comprises:

envelope detecting the modulated signal;

envelope detecting a signal in the phase locked loop; and comparing the envelope detected modulated signal and the envelope detected signal in the phase locked loop to produce the amplitude signal.

16. A modulation method comprising:

modulating in-phase and quadrature signals to produce a modulated signal;

producing a phase signal from the modulated signal that is responsive to phase changes in the modulated signal and that is independent of amplitude changes in the modulated signal using a phase locked loop that includes a controlled oscillator having a controlled oscillator output, wherein the modulating is performed within the phase locked loop;

producing an amplitude signal from the modulated signal that is responsive to amplitude changes in the modulated signal and that is independent of phase changes in the modulated signal;

amplifying the phase signal at a gain that is varied in response to the amplitude signal;

wherein the producing an amplitude signal from the modulated signal comprises automatic gain controlling the modulated signal to produce the amplitude signal; and wherein the automatic gain controlling comprises:

envelope detecting the modulated signal;

envelope detecting the amplified phase signal; and comparing the envelope detected modulated signal and the envelope detected amplified phase signal to produce the amplitude signal.

17. A modulation method comprising:

modulating in-phase and quadrature signals to produce a modulated signal;

producing a phase signal from the modulated signal that is responsive to phase changes in the modulated signal and that is independent of amplitude changes in the modulated signal using a phase locked loop that includes a controlled oscillator having a controlled oscillator output, wherein the modulating is performed within the phase locked loop;

producing an amplitude signal from the modulated signal that is responsive to amplitude changes in the modulated signal and that is independent of phase changes in the modulated signal;

amplifying the phase signal at a gain that is varied in response to the amplitude signal; and wherein the producing an amplitude signal from the modulated signal comprises:

envelope detecting the modulated signal to produce the amplitude signal.

* * * * *